(12) United States Patent
Dudnikov

(10) Patent No.: US 9,161,447 B2
(45) Date of Patent: Oct. 13, 2015

(54) EMBEDDED CAPACITIVE STACK

(75) Inventor: George Dudnikov, San Jose, CA (US)

(73) Assignee: Sanmina-SCI Corporation, San Jose, CA (US)

( * ) Notice: Subject to any disclaimer, the term of this patent is extended or adjusted under 35 U.S.C. 154(b) by 1189 days.

(21) Appl. No.: 12/045,660

(22) Filed: Mar. 10, 2008

(65) Prior Publication Data
US 2008/0217049 A1    Sep. 11, 2008

Related U.S. Application Data

(60) Provisional application No. 60/894,198, filed on Mar. 10, 2007.

(51) Int. Cl.
| | |
|---|---|
| *H05K 1/16* | (2006.01) |
| *H05K 1/02* | (2006.01) |
| *H05K 1/18* | (2006.01) |
| *H01G 4/06* | (2006.01) |
| *H01G 4/30* | (2006.01) |
| *H05K 1/11* | (2006.01) |
| *H05K 3/46* | (2006.01) |

(52) U.S. Cl.
CPC ................ *H05K 1/162* (2013.01); *H01G 4/06* (2013.01); *H01G 4/30* (2013.01); *H01G 4/306* (2013.01); *H05K 1/0216* (2013.01); *H05K 1/0231* (2013.01); *H05K 1/18* (2013.01); *H05K 3/4641* (2013.01); *H05K 1/113* (2013.01); *H05K 3/4602* (2013.01); *H05K 2201/0191* (2013.01); *H05K 2201/0209* (2013.01); *H05K 2201/0257* (2013.01); *H05K 2201/0355* (2013.01); *H05K 2201/093* (2013.01); *H05K 2201/09309* (2013.01); *H05K 2201/09518* (2013.01); *H05K 2201/09663* (2013.01); *H05K 2203/162* (2013.01); *Y10T 29/43* (2015.01); *Y10T 29/435* (2015.01); *Y10T 29/49036* (2015.01); *Y10T 29/49126* (2015.01); *Y10T 29/49128* (2015.01); *Y10T 29/49155* (2015.01)

(58) Field of Classification Search
CPC ........... H01G 4/06; H01G 4/306; H01G 4/30; H05K 1/162; H05K 3/4641; H05K 2203/162; H05K 1/113; H05K 3/4602; H05K 2201/0191; H05K 2201/0209; H05K 2201/0257; H05K 2201/0355; H05K 2201/093; H05K 2201/09309; H05K 2201/09518; H05K 2201/09663
See application file for complete search history.

(56) References Cited

U.S. PATENT DOCUMENTS

| | | | | |
|---|---|---|---|---|
| 5,742,471 | A * | 4/1998 | Barbee et al. | 361/312 |
| 6,333,857 | B1 * | 12/2001 | Kanbe et al. | 361/792 |
| 7,428,137 | B2 * | 9/2008 | Dowgiallo, Jr. | 361/321.2 |
| 7,429,510 | B2 * | 9/2008 | Das et al. | 438/253 |
| 7,629,269 | B2 * | 12/2009 | Palanduz | 438/761 |

(Continued)

*Primary Examiner* — Ishwarbhai B Patel
(74) *Attorney, Agent, or Firm* — Loza & Loza, LLP; Julio M. Loza

(57) ABSTRACT

A novel method for manufacturing embedded a capacitive stack and a novel capacitive stack apparatus are provided having a capacitive core that serves as a structural substrate on which alternating thin conductive foils and nanopowder-loaded dielectric layers may be added and tested for reliability. This layering and testing allows early fault detection of the thin dielectric layers of the capacitive stack. The capacitive stack may be configured to supply multiple isolated capacitive elements that provide segregated, device-specific decoupling capacitance to one or more electrical components. The capacitive stack may serve as a core substrate on which a plurality of additional signaling layers of a multilayer circuit board may be coupled.

16 Claims, 11 Drawing Sheets

(56) References Cited

U.S. PATENT DOCUMENTS

| | | |
|---|---|---|
| 7,705,423 B2 * | 4/2010 | Swaminathan et al. ...... 257/532 |
| 2005/0108874 A1 * | 5/2005 | Lee et al. ........................ 29/849 |
| 2005/0122662 A1 * | 6/2005 | Hayashi et al. ............ 361/306.3 |
| 2006/0151863 A1 * | 7/2006 | Das et al. ...................... 257/678 |
| 2007/0151758 A1 * | 7/2007 | Dunn et al. ................... 174/262 |
| 2007/0158105 A1 * | 7/2007 | Kitao et al. ................... 174/261 |

* cited by examiner

EMBEDDED CAPACITIVE STACK

CLAIM OF PRIORITY UNDER 35 U.S.C. §119

The present Application for Patent claims priority to Provisional Application No. 60/894,198 entitled "Embedded Capacitive Stack" filed Mar. 10, 2007 and is hereby expressly incorporated by reference herein.

FIELD

Various embodiments of the invention pertain to circuit boards/substrates, chip package substrates, backplanes, flex and rigid circuits, and electronic modules. At least one embodiment of the invention pertains to an embedded capacitive stack for multilayer circuit boards.

BACKGROUND

Electronic circuit devices are commonly used in both digital and analog circuits. In digital signal processing, signals change from one binary level to another. Such signals often become distorted due to resistance, capacitance, and/or inductance along its path on a circuit board. Moreover switching from one binary level to another often gives rise to still other distortions and spurious signals, e.g., noise, and induced signals on other electrical paths on the circuit board. In the art of circuit design and circuit board manufacturing, capacitors are commonly employed in order to reduce electromagnetic interference, decouple signals, reduce or dampen resonances, suppress current/voltage noise, improve signal quality, filter signals, and several further such purposes and/or functions.

Historically, discrete bypass capacitors have been used with specific active devices for high-frequency decoupling (e.g., resonance dampening, noise suppression, etc.) and still are employed when designers do not face space constraints. However, with the increased complexity of circuits and the reduction in the size of electronic products, the space on the surface of a circuit board is often limited and does not allow room for numerous surface mounted decoupling capacitors. Additionally, the electrical vias required by the discrete capacitors introduce unwanted parasitic inductance at higher frequencies. Consequently, an embedded decoupling capacitance (or buried capacitance) is typically used to eliminate the need for bypass capacitors mounted in the vicinity of each integrated circuit mounted to the board.

Attempts at providing embedded decoupling capacitance are known in the art. For example, in U.S. Pat. No. 5,079,069 to Howard et al, an integral buried capacitor is provided comprising a sheet of dielectric material that is sandwiched between two sheets of conductive material. Howard, thus, discloses a printed circuit board (PCB) that provides capacitance to each individual device by a portion of the capacitor laminate proportional to the individual device and borrowed capacitance from other portions of the capacitor laminate, depending upon the random operation of the devices.

While PCBs using an integrated capacitive laminate, such as the one disclosed by Howard et al., are generally successful in providing capacitance to a device, in certain applications the capacitance supplied by such integrated capacitive laminates is limited or insufficient. For example, because of their potential for interference and noise, certain high power, high switching speed integrated circuit (IC) devices often demand a decoupling capacitance that exceeds that which can be supplied by integrated capacitive laminates similar to those disclosed by Howard et al. In those circumstances, circuit designers employ additional localized, surface mounted capacitors in order to provide sufficient decoupling capacitance for the IC device. Such localized, surface mounted capacitors, however, are undesirable for the reasons discussed above.

Prior art capacitor laminates also suffers from a further deficiency in that the electronic device are all connected to the same embedded capacitive laminate, causing potential interference between devices. For instance, high power, high switching speed IC devices may cause significant voltage and/or current variations, or noise that potentially interferes with other low-noise devices on the circuit board that may also be coupled to the capacitive laminate.

In order to deal with the increased capacitance needs of high power, high switching speed IC devices, integrated capacitive laminates with increased capacitance have been developed, wherein several laminates are stacked together and connected in parallel. U.S. Pat. No. 6,739,027 to Lauffer et al., for example, discloses a capacitive PCB that is fabricated by taking a first conductive foil and coating both sides with a dielectric. Second and third conductive foils are also coated with a dielectric on one side and each foil is attached to the first dielectric coated foil by the uncoated side of the second and third foils. The second and third foils are each then laminated to a circuitized core creating four total capacitive planes that are connected in parallel with each other thereby increasing the capacitance density.

Thus, Lauffer et al., like Howard et al., provides a PCB that supplies capacitance to each individual device by a portion of the capacitor laminate proportional to the individual device and borrowed capacitance from other portions of the capacitor laminate, depending upon the random firing of the devices. Although Lauffer et al. increases the capacitive density, the devices still share the same capacitor laminate. Consequently, low-noise devices continue to be subject to interference from the noise produced by the high power, high switching speed IC devices described above.

Use of a thin dielectric layer made from powdered resin materials or filled resin systems are known in the art for their high dielectric constants that makes it possible to increase capacitance density. Lauffer et al. discloses a PCB incorporating the use of a thin, non-cured (B-stage) dielectric. However, the process of manufacturing stacked integrated capacitive laminates disclosed by Lauffer et al. becomes difficult when using these thin dielectrics. The nanopowder loading in thin dielectrics is very brittle and virtually impossible to manufacture without special handling and processing. Furthermore, using a thin dielectric creates the increased possibility that the conductive foils that sandwich the dielectric will have inclusions or voids that compromise the electrical integrity, creating a short in the capacitor and risk starting a fire. Testing for shorts is not possible until the stacked capacitive element is finished. If a defect is discovered the entire PCB must be scrapped, resulting in a potentially high monetary loss.

Thus, there remains a long felt need in the art for providing stacked integrated or embedded capacitors with very thin dielectric thickness and high Dk due to nanoloading on a circuit board capable of being connected in parallel in order to increase capacitance density or alternatively capable of providing separate capacitance for noisier devices and quieter devices. There is also a long felt need to identify faults and defects in a stacked capacitive core before adding subsequent core layers or circuit layers are added.

SUMMARY

One feature provides a method for manufacturing a capacitive stack with high capacitive density. A planar core capacitive substrate is formed including a first dielectric core layer sandwiched between a first conductive layer and a second conductive layer. The core capacitive substrate may provide structural rigidity for coupling additional conductive and dielectric layers. A first conductive foil may be coated with a second dielectric layer that may include an uncured or semi-cured dielectric material loaded with a nanopowder selected to achieve a desired dielectric constant. An exposed surface of the second dielectric layer may be coupled to the first conductive layer and the dielectric material of the second dielectric layer may then be cured.

A pattern of one or more clearances may be formed on the first conductive layer. The one or more clearances on the first conductive layer may be filled with an epoxy prior to coupling the second dielectric layer to the first conductive layer. The epoxy may be cured prior to coupling the second dielectric layer to the first conductive layer. The epoxy may be planarized prior to coupling the second dielectric layer to the first conductive layer.

Additionally, a second conductive foil may be coated with a third dielectric layer that may include an uncured or semi-cured dielectric material loaded with a nanopowder selected to achieve a desired dielectric constant. An exposed surface of the third dielectric layer may be coupled to the second conductive layer and the dielectric material of the third dielectric layer is cured.

The first conductive foil and first conductive layer may define a first capacitive element and the second conductive foil and second conductive layer may define a second capacitive element. A first electrically conductive via may be formed between the first conductive layer and second conductive foil. Similarly, a second electrically conductive via may be formed between the second conductive layer and first conductive foil. A capacitive element having increased capacitive density may be formed between the first conductive layer-second conductive foil and the second conductive layer-first conductive foil.

In another example, a first isolated capacitive element may be formed between the first conductive layer and the first conductive foil. A second isolated capacitive element may be formed between the second conductive layer and the second conductive foil. Likewise, a third isolated capacitive element may be formed between the first conductive layer and the second conductive layer.

According to one feature, one or more alternating conductive foils and dielectric layers may be coupled on at least one side of the core capacitive substrate. The integrity of the dielectric layers may be tested as they are stacked onto the core capacitive substrate.

In some examples, the second dielectric layer may include a dielectric film, and coating the first conductive foil with the second dielectric layer may include laminating the dielectric film on the first conductive foil.

According to some examples, the thickness of the second dielectric layer may be less than the thickness of first dielectric layer. The second dielectric layer may be coated to a thickness of approximately between 0.004 mil and 1.25 mil. In one example, the second dielectric layer may be coated to a thickness of approximately 0.3 mil or less. The first conductive foil and second conductive foil may be ultra-thin foils of having a thickness of 0.12 mil and 4 mil. The core capacitive substrate may have a thickness of approximately between 0.25 mil and 4 mil. The second dielectric layer may provide a capacitive density of between five (5) and sixty (60) nano-Farads per square inch.

According to another example, a first region on the first conductive foil is formed that is electrically isolated from the remaining portions of the first conductive foil. The first region and the first conductive layer may form a capacitive element distinct from the remaining portions of the first conductive foil and first conductive layer. The size of the first region and a capacitive density of the second dielectric layer are selected to achieve a desired capacitive value.

Consequently, a capacitive stack with high capacitive density is provided comprising: (a) a planar core capacitive substrate including a first core dielectric layer sandwiched between a first conductive layer and a second conductive layer, wherein the core capacitive substrate provides structural rigidity for coupling additional conductive and dielectric layers; (b) a second dielectric layer having a first planar surface coupled to the first conductive layer, the second dielectric layer being thinner than the first core dielectric layer and including a dielectric material loaded with a nanopowder selected to achieve a desired dielectric constant; (c) a first conductive foil coupled to a second planar surface of the second dielectric layer; wherein the thickness of the second dielectric layer is less than the thickness of first dielectric layer; and/or (d) one or more alternating conductive foils and dielectric layers coupled on at least one side of the capacitive core substrate. The first and second conductive layers and the first conductive foil may be alternating power and ground planes. At least one of the first and second conductive layers may include a pattern of one or more clearances. In one example, the second dielectric layer is coated to a thickness of approximately between 0.004 and 1.25 mil. In another example, the first conductive foil may be an ultra-thin foil having a thickness of between 1 and 4 mil or a thickness of between 0.12 and 1 mil. The second dielectric layer may provide a capacitive density of between five (5) and sixty (60) nano-Farads per square inch.

A method for manufacturing a multilayer embedded capacitive stack is also provided. A planar core capacitive substrate is formed including a first dielectric core layer sandwiched between a first conductive layer and a second conductive layer. The core capacitive substrate provides structural rigidity for additional conductive and dielectric layers. A first conductive foil is coated with an uncured or semi-cured dielectric material to form a second dielectric layer. The uncured or semi-cured dielectric material may be loaded with a nanopowder selected to achieve a desired dielectric constant. The second dielectric layer may be coupled to the first conductive layer and the integrity of the second dielectric layer may be tested. The capacitive stack may be discarded if a defect is found in the second dielectric layer. The second dielectric layer may have a defect if the first conductive layer and first conductive foil are electrically coupled. The second dielectric layer may also have a defect if the impedance between the first conductive layer and first conductive foil is less than a desired threshold value. Coupling an exposed surface of the second dielectric layer to the first conductive layer may include using an epoxy layer between the second dielectric layer to the first conductive foil. The integrity of the second dielectric layer is tested prior to coupling additional layers onto the first conductive foil.

Additionally, a second conductive foil may be coated with the uncured or semi-cured dielectric material to form a third dielectric layer. An exposed surface of the third dielectric layer may be coupled to the second conductive layer and the integrity of the third dielectric layer may be tested. The exposed surface of the third dielectric layer may be coupled to the second conductive layer at the same time that the exposed surface of the second dielectric layer is coupled to the first conductive layer. The integrity of the second dielectric layer and the third dielectric layer may be tested at the same time.

Similarly, one or more alternating conductive foils and dielectric layers may be coupled on at least one side of the core capacitive substrate. The integrity of each dielectric layer may be tested as it is added to the capacitive stack.

In an alternative method for manufacturing a multilayer embedded capacitive stack, a planar capacitive core substrate is formed including a core first dielectric layer sandwiched between a first conductive layer and a second conductive layer, wherein the core capacitive substrate provides structural rigidity for additional conductive and dielectric layers. The first conductive layer is coated with an uncured or semi-cured dielectric material to form a second dielectric layer, wherein the uncured or semi-cured dielectric material is loaded with a nanopowder selected to achieve a desired dielectric constant. A first conductive foil may be coupled onto an exposed surface of the second dielectric layer and the integrity of the second dielectric layer is tested.

Consequently, a capacitive stack is provided comprising: (a) a planar capacitive core substrate including a first dielectric layer sandwiched between a first conductive layer and a second conductive layer, wherein the first dielectric layer provides structural rigidity for additional conductive and dielectric layers; (b) a second dielectric layer sandwiched between a first conductive foil and the first conductive layer, wherein the second dielectric layer is thinner than the first dielectric layer and includes dielectric material loaded with a nanopowder; (c) a first isolated capacitive element defined between the first conductive layer and the second conductive layer; (d) a second isolated capacitive element defined between the first conductive foil and the first conductive layer; (e) a third dielectric layer sandwiched between the second conductive layer and a second conductive foil; and/or (f) a third isolated capacitive element defined between the second conductive layer and the second conductive foil. A first electrically conductive via may be coupled between the first conductive layer and second conductive foil and a second electrically conductive via may be coupled between the second conductive layer and first conductive foil to form a capacitive element having increased capacitive density between the first conductive layer and second conductive foil and the second conductive layer and first conductive foil.

The first conductive layer and second conductive foil may serve as power layers while the second conductive layer and first conductive foil serve as ground layers.

In one example, the thickness of the second dielectric layer is less than the thickness of first dielectric layer. For instance, the first dielectric layer may have a thickness of approximately between 0.5-4 mils, the first and second conductive layers may each have a thickness of between 0.5-6 mils, the second dielectric layer may have a thickness of approximately between 0.08 and 1.25 mil (or between 0.004 and 1 mil or approximately 0.3 mil or less), and the first conductive foil may have a thickness of approximately between 0.25-1.5 mils (or between 1 and 4 mil or between 0.12 and 1 mil). The first conductive foil may include a first region electrically isolated from the first conductive foil, wherein the first region and the first conductive layer define a first discrete capacitive element. The area of the first region may be selected to obtain a desired capacitive value for the first discrete capacitive element.

A method for manufacturing electronic interconnect platform is also provided comprising (a) forming a planar embedded capacitive stack and (b) coupling one or more signal layers on at least one side of the embedded capacitive stack. The capacitive stack may include (a) a planar core capacitive substrate including a first dielectric layer sandwiched between a first conductive layer and a second conductive layer, wherein the core capacitive substrate provides structural rigidity for additional conductive layers and thinner dielectric layers; (b) one or more alternating dielectric layers and conductive foils coupled on at least one side of the planar core capacitive substrate, wherein the one or more dielectric layers include a dielectric material loaded with a nanopowder and are thinner than the first dielectric layer; (c) wherein the first, and second conductive layers and the one or more alternating dielectric layers and conductive foils are adapted to operate as segregated capacitive elements. A first region may be formed in a first conductive foil from among the one or more conductive foils that is electrically isolated from the third conductive foil. The first region and an adjacent conductive layer may define a first segregated capacitive element electrically distinct from the remaining portions of the first conductive foil. This method may also be used to form a chip-scale package may be formed that houses the planar embedded capacitive stack and the one or more signal layers.

Consequently, an electronic interconnect platform is provided comprising a planar embedded capacitive stack and one or more signal layers coupled on at least one side of the embedded capacitive stack. The embedded capacitive stack may include (a) a planar capacitive core substrate including a first dielectric layer sandwiched between a first conductive layer and a second conductive layer, wherein the first dielectric layer provides structural rigidity for additional conductive and dielectric layers; (b) one or more alternating dielectric layers and conductive foils coupled on at least one side of the planar capacitive core substrate, wherein the one or more dielectric layers include a dielectric material loaded with a nanopowder; and/or (c) wherein the first and second conductive layers and the one or more alternating dielectric layers and conductive foils are configurable to operate as segregated capacitive elements.

The electronic interconnect platform may also include a first circuit component coupled to an exterior signal layer and electrically coupled to a first segregated capacitive element formed between a first conductive foil and the first conductive layer in the embedded capacitive stack. The first circuit component may be further coupled to a second segregated capacitive element formed between the first conductive layer and a second conductive foil in the embedded capacitive stack, the second segregated capacitive element being distinct from the first segregated capacitive element. The electronic interconnect platform may further include a chip-scale package housing the planar embedded capacitive stack, the one or more signal layers, and the first circuit component. Additionally, a first region in a third conductive foil from among the one or more conductive foils may be electrically isolated from the third conductive foil, and the first region and an adjacent conductive foil may define a first discrete capacitor electrically isolated from the remaining portions of the third conductive foil.

Other features and advantages of the present invention will become apparent in the following detailed description of the preferred embodiment of the invention taken in conjunction with the accompanying drawings and examples.

DETAILED DESCRIPTION

Figure 1:
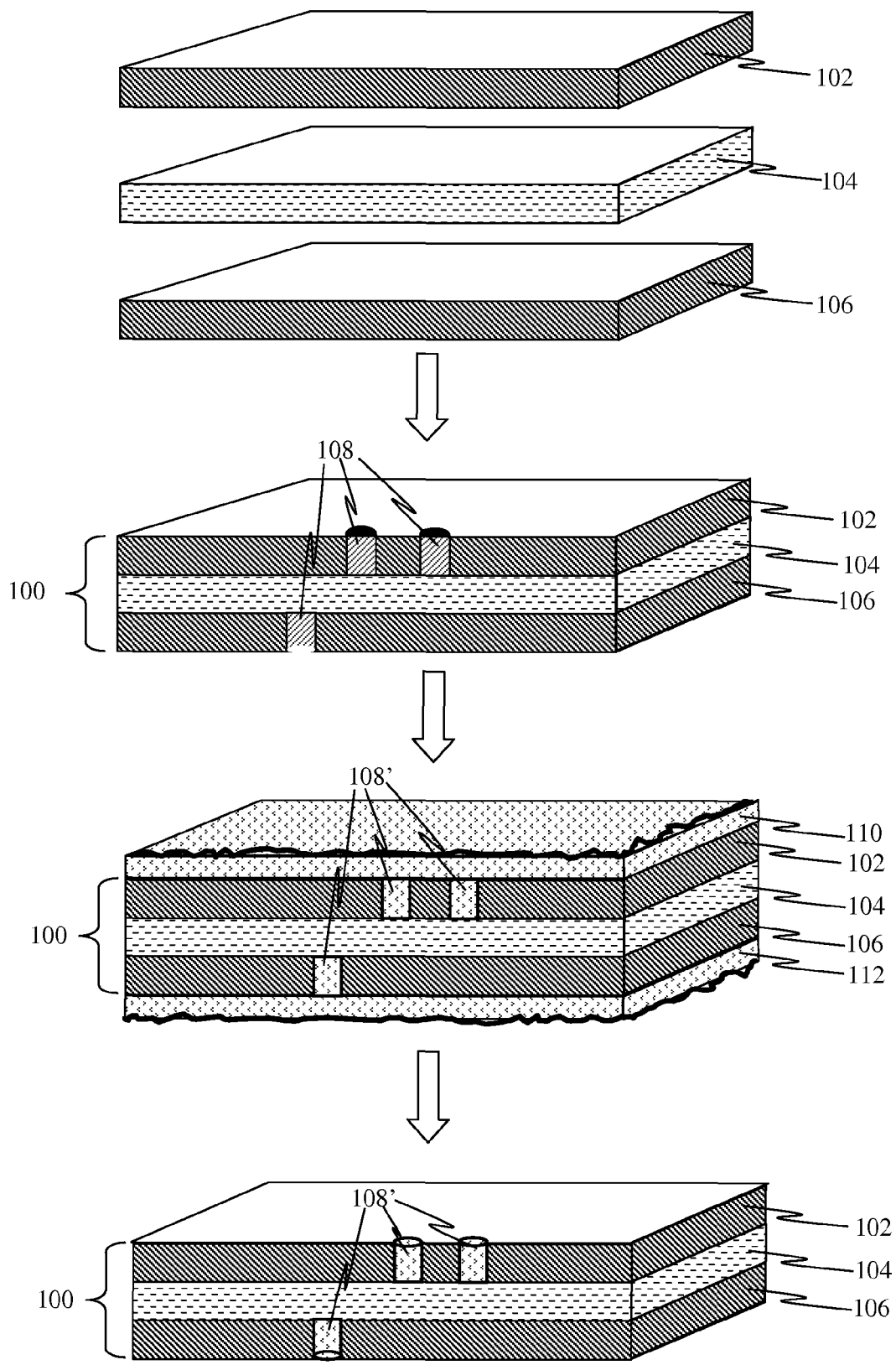
FIG. 1 illustrates the construction of a core capacitive element that may be used as part of a stacked capacitor according to one example.

In the following description numerous specific details are set forth in order to provide a thorough understanding of the invention. However, one skilled in the art would recognize that the invention might be practiced without these specific details. In other instances, well known methods, procedures, and/or components have not been described in detail so as not to unnecessarily obscure aspects of the invention.

In the following description, certain terminology is used to describe certain features of one or more embodiments of the invention. For instance, "core" refers to a substrate that mechanically supports one or more layers. The "core" may include one or more base layers to which one or more circuit board layers are coupled on one or both sides. The term "embedded" refers to a location below the surface of a printed circuit board. The term "foil" refers to a thin flexible layer (e.g., lacking structural rigidity) of metallic and/or electrically conductive material. The term "electronic interconnect platform refers to a printed circuit board, PCB, circuit board, substrate, chip module, and/or multi-chip module that may include one or more layers of electrically insulating material and/or conductive material with conductive traces and/or vias that provide a base for attaching and/or forming electronic components. As such, these terms include conductive and/or dielectric layers of all sizes and dimensions used on various applications, including conventional multilayer boards, silicon substrates, chip-scale devices, chip-scale packaging, semiconductor devices, among others.

A first novel feature provides a way to increase the capacitive density of a core capacitive stack by stacking thin layers of capacitive elements (e.g., alternating dielectric layers and conductive foils) on a core capacitive substrate. The dielectric constant of the capacitive elements may be modified or adjusted by using nanopowder-loaded (resin) dielectric layers between conductive foil layers to increase the capacitive density of the core capacitive stack. The use of thin dielectric layers and conductive foils allows increasing the capacitive density while limiting the overall thickness of the capacity stack.

A second novel feature provides a method for manufacturing a capacitive stack is provided that allows capacitive layers to be tested for defects as they are added to the capacitive stack or as a composite. A core substrate is formed having dielectric layer sandwiched between two conductive layers/foils. The dielectric layer is cured (C-stage) so that the core substrate is semi-rigid or rigid, providing a structure onto which flexible conductive foils may be laminated. Conductive foils are then coated with an uncured or partially cured nanopowder loaded dielectric material (B-stage resin) and layered on either side core substrate, with the uncured or semi-cured dielectric material adjacent the conductive layers of the core substrate. Additional conductive foils coated with the uncured nanopowder loaded dielectric material may be layered, cured, and tested as the multilayered circuit board is manufactured. This layering, curing, and testing allows early fault detection of problems with the stacked capacitor.

A third novel feature provides a printed circuit board including a capacitive stack configured to supply segregated, device-specific decoupling capacitance to one or more devices on the circuit board, a multi-chip module, and/or a semi-conductor package. Thus, instead decoupling of all electronic devices on a PCB with a shared embedded capacitance, this feature provides multiple isolated capacitive elements capable of being coupled to different electronic devices.

A fourth novel feature provides for embedding one or more discrete capacitors in a core capacitive stack that may be used within a multilayered circuit board to provide localized decoupling capacitance to one or more circuit components and/or a semi-conductor package. The one or more discrete capacitors formed within the core capacitive stack may be sized to have different values to satisfy the capacitance needs of one or more circuit components and/or semi-conductor device. Additionally, the discrete capacitors may also provide power isolation for different components. The stacked capacitor may be constructed and tested for reliability as the dielectric layers and conductive foils are added to the stack prior to embedding the stack into the circuit board.

A fifth novel feature provides for using a capacitive stack within a chip-scale package to bring decoupling capacitance closer to a signal source, thereby reducing undesirable parasitic inductance at higher operating frequencies.

Increasing Capacitive Density of a Core Capacitive Stack

In the prior art, single capacitive planar cores have been used to provide decoupling capacitance to circuit boards. However, increasing the capacitive density of a capacitive core to accommodate decoupling of higher frequencies typically requires significantly decreasing the thickness of the capacitive core. This is because increasing the thickness of a capacitive core is undesirable as it increases the thickness of circuit boards and increases parasitic inductance at higher frequencies.

To address the shortcomings of the prior art, one feature increases the capacitive density of a core capacitive stack by stacking thin layers of capacitive elements (e.g., alternating dielectric layers and conductive foils) on a core base substrate. The dielectric constant of the capacitive elements may be modified or adjusted by using nanopowder-loaded (resin) dielectric layers between conductive layers to increase the capacitive density of the core capacitive stack.

FIG. 1 illustrates the construction of a core capacitive substrate 100 that may be used as part of an embedded capacitive stack according to one example. The core capacitive substrate 100 may include a core dielectric layer 104 sandwiched between a first conductive layer or foil 102 and a second conductive layer or foil 106. The core dielectric layer 104 may be made from a cured or C-stage dielectric material. Using a C-stage dielectric layer in the core capacitive substrate 100 provides increased rigidity to subsequent layers of the stacked capacitor. In various examples, the core dielectric layer 104 may be (or include) polymide, teflon, epoxy, resin, and/or film. Thus, core capacitive substrate 100 serves as a base on which subsequent additional dielectric and conductive layers may be added to create additional capacitive elements. The first conductive layer 102 and second conductive foil 106 may be patterned, either before or after coupling to the core dielectric layer 104, to form ground and/or power clearances or isolations 108, for example, that may be subsequently used to electrically connect two or more conductive layers of the capacitive stack or to couple to one or more electrical components of a circuit. In some examples, the clearances 108 may be formed, for example, chemical or mechanical processing of the conductive layers 102 and/or 106 such as etching.

The core capacitive substrate 100 may then serve as a rigid or semi-rigid planar structure or substrate onto which thinner and difficult-to-process dielectric and/or conductive layers may be alternatively or interchangeably stacked to increase the capacitive density.

According some examples and implementations, the dielectric layer 104 may be approximately between 0.5 to 4 mils thick and each conductive layer 102 and 106 may be between 0.25 and 6 mils thick.

In some implementations, a layer 110 and 112 of epoxy or some other filler paste (e.g., non-conductive or dielectric material) may be added to the planar surfaces of the first conductive layers/foils 102 and/or 106 to fill-in cavities, voids, and/or clearances 108. Filling these cavities, voids, and/or clearances 108 may help prevent deformation of the subsequent thinner layers that may be stacked and coupled to the core capacitive substrate. Note that the epoxy or filler paste (e.g., dielectric paste, epoxy ink, etc.) may be applied, for example, by coating or dipping and may be of sufficiently thick to fill-in cavities, voids, and/or clearances 108 on the conductive layers 102 and 106. The filled clearances are illustrated by reference number 108'.

The epoxy or filler 110 and 112 may then be cured or semi-cured and then planarized (e.g., by grinding planarization or other chemical or mechanical processing) to remove excess epoxy or filler paste and provide a substantially flat surface. Except for the epoxy or paste filler in the clearances 108', planarization may completely or substantially remove the excess epoxy or paste filler so that the surface(s) of the conductive layers 102 and/or 106 may be exposed.

Figure 2:
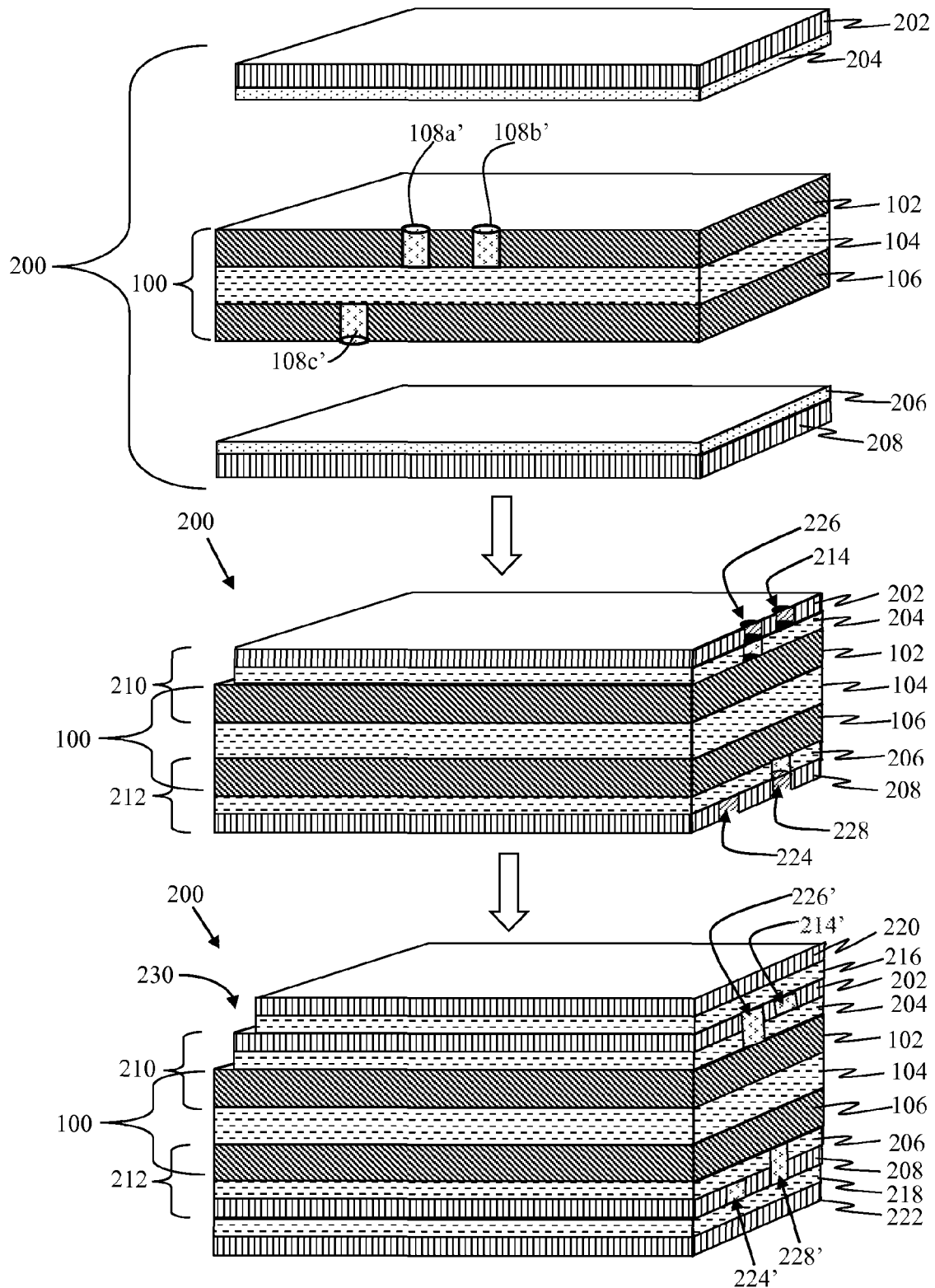
FIG. 2 illustrates the addition of capacitive layers to the core capacitive element to form a capacitive stack having increased capacitive density according to one example.

FIG. 2 illustrates the addition of capacitive layers to the core capacitive substrate 100 to form a capacitive stack 200 having increased capacitive density according to one example. The capacitive stack 200 is formed by coupling a third conductive foil 202 and a thin first dielectric layer 204 on one side of the core capacitive substrate 100. The exposed surface of first dielectric layer 204 may be coupled to the exposed surface of the first conductive foil 102 to form a capacitive element 210. Similarly, a fourth conductive foil 208 and a thin second dielectric layer 206 are coupled on an opposite side of the core capacitive substrate 100. The exposed surface of the second dielectric layer 206 may be coupled with the exposed surface of the second conductive foil 106 to form another capacitive element 212. Note that, in some implementations, the third conductive foil 202 and the first dielectric layer 204 and the fourth conductive foil 208 and the second dielectric layer 206 may be coupled or added to the core capacitive substrate 100 at the same time.

The third conductive foil 202 and fourth conductive foil 208 may be patterned, e.g., after coupling to the core dielectric layer 104, to define or form power and/or ground clearances or isolations 214 and 224, for example. Such clearances 214 and 224 may subsequently allow forming appropriate electrical connections to and/or through one or more layers of the capacitive stack 200. Note in some implementations, the clearances 214 and 228 may be filled with an epoxy or filler paste (illustrated as 214' and 228') prior to coupling additional layers onto the third conductive foil 202 and fourth conductive foil 208. In other implementations, if the third conductive foil 202 and fourth conductive foil 208 are sufficiently thin, they may simply be filled by the uncured dielectric of a subsequently added dielectric layer.

The dielectric layers 204 and 206 may include a nanopowder-loaded dielectric material. In various examples, the dielectric layers 204 and 206 may include dielectric film sheets, gel, liquid, and/or powder. The dielectric layers 204 and 206 may be coated, laminated and/or coupled to the conductive foils 202 and 208 (e.g., cooper foils), respectively, by any means known in the industry, such as roller, lamination, screen printing, powder or curtain coating, spraying, vapor deposition, and/or dipping. Any of these or other known methods may be used in forming a thin, substantially uniform dielectric film/layer on a conductive foil. In some implementations, the dielectric layers 204 and/or 206 may be (or include) polymers, sol-gels, thin films, in an uncured or semi-cured state that allow coupling to the core capacitive substrate 100. Note that, depending on the material used in the dielectric layers 204 and/or 206, an additional thin adhesive layer may be added for better adhesion to the core capacitive substrate 100. In one example, the dielectric layers 204 and/or 206 and/or conductive foils 202 and/or 206 may be quite thin in order to reduce the overall thickness of the capacitive stack 200 and/or printed circuit board in which it is used. For instance, the dielectric layers 204 and 206 may each be between one-tenth (0.1) and twenty-four (24) micrometers (micron) while the conductive foils 202 and/or 206 may each be between an eighth of an ounce (⅛ oz) and six ounce (6 oz) foils. Making the capacitive stack 200 and/or printed circuit board as thin as possible is desirable in that it reduces the parasitic inductance associated with the capacitive stack 200 at higher frequencies. The capacitive density of the capacitive stack 200 may be increased or decreased by using a nanopowder loaded material of a desired dielectric constant (Dk). For example, a nanopowder loaded resin (e.g., Oak MC8TR) may be used to achieve 22 nanofarads per square inch. Additionally, the number of capacitive layers in the capacitive stack may also be increased to increase its capacitive density. As an example, by utilizing multiple planar capacitive layers in combination, a total capacitance of 44 nanofarads per square inch (or more) may be achieved by using the two dielectric layers 204 and/or 206 (e.g., each layer providing 22 nanofarads per square inch). Greater capacitive densities may be achieved by selecting an appropriate dielectric material or by increasing the number of dielectric and conductive layers.

Typically, a thin layer of nanopowder loaded dielectric material is quite brittle and difficult to handle during manufacturing of a multilayer circuit board. However, by depositing or coupling the thin dielectric layers 204 and 206 in an uncured or partially cured form on the substantially rigid core capacitive substrate 100, the integrity of the thin dielectric layers 204 and 206 is maintained, thus allowing high yield processing of these conductive foils. Because the core capacitive substrate 100 serves as a structural core, the subsequent dielectric and conductive layers can be very thin or ultra-thin, thus making the capacitive stack and/or the multilayer circuit board in which such capacitive stack is embedded thinner than conventional manufacturing techniques.

The dielectric layers 204 and 206 may be cured when they are coupled to the core capacitive substrate 100 by heat and/or pressure. Because the thin dielectric layers 204 and/or 206 are cured after they have been coupled to the substantially rigid core capacitive substrate 100, the risk of defects in the dielectric layers 204 and/or 206 due to the brittleness of the dielectric layers is reduced.

The conductive foils may be either power planes or ground planes, as long as each capacitive element 210, 100, and 212 contains at least one power plane and one ground plane separated by a dielectric layer. Thus, in one example, conductive foils 202 and 106 may be ground planes while conductive foils 102 and 208 may be power planes. Alternatively, conductive foils 102 and 208 may be ground planes while conductive foils 202 and 106 may be power planes. The conductive foils may be structurally rigid sheets or they may be thin paper-like conductive layers with little or no rigidity. For example, the conductive foils 202 and/or 208 and/or the uncured or semi-cured dielectric layers 204 and/or 206 may be flexible (non-rigid layers) before being coupled to the core capacitive substrate 100. After coupling to the core capacitive substrate 100, the dielectric layers 204 and/or 206 may be cured and become more rigid and/or brittle.

In some implementations, additional patterning of clearances 214 may then be formed on one or both of the conductive foils 202 and 208 by etching or other mechanical or chemical process.

Additional dielectric layers 216 and 218 and/or conductive foils 220 and 222 may be similarly coupled onto the previous conductive foils 202 and 208, respectively, to increase the capacitive density of the capacitive stack 200. Each of these additional conductive foils 220 and 222 may also be patterned with clearances. Note that in some implementations, an epoxy or filler paste may also be added on a conductive foil to fill-in the clearances prior to coupling a subsequent dielectric layer/conductive foil. In yet other implementations, the dielectric layer 216 may be in an uncured or semi-cured state so that it fills the clearance 214 of the conductive foil onto which it is stacked and coupled.

Figure 3:
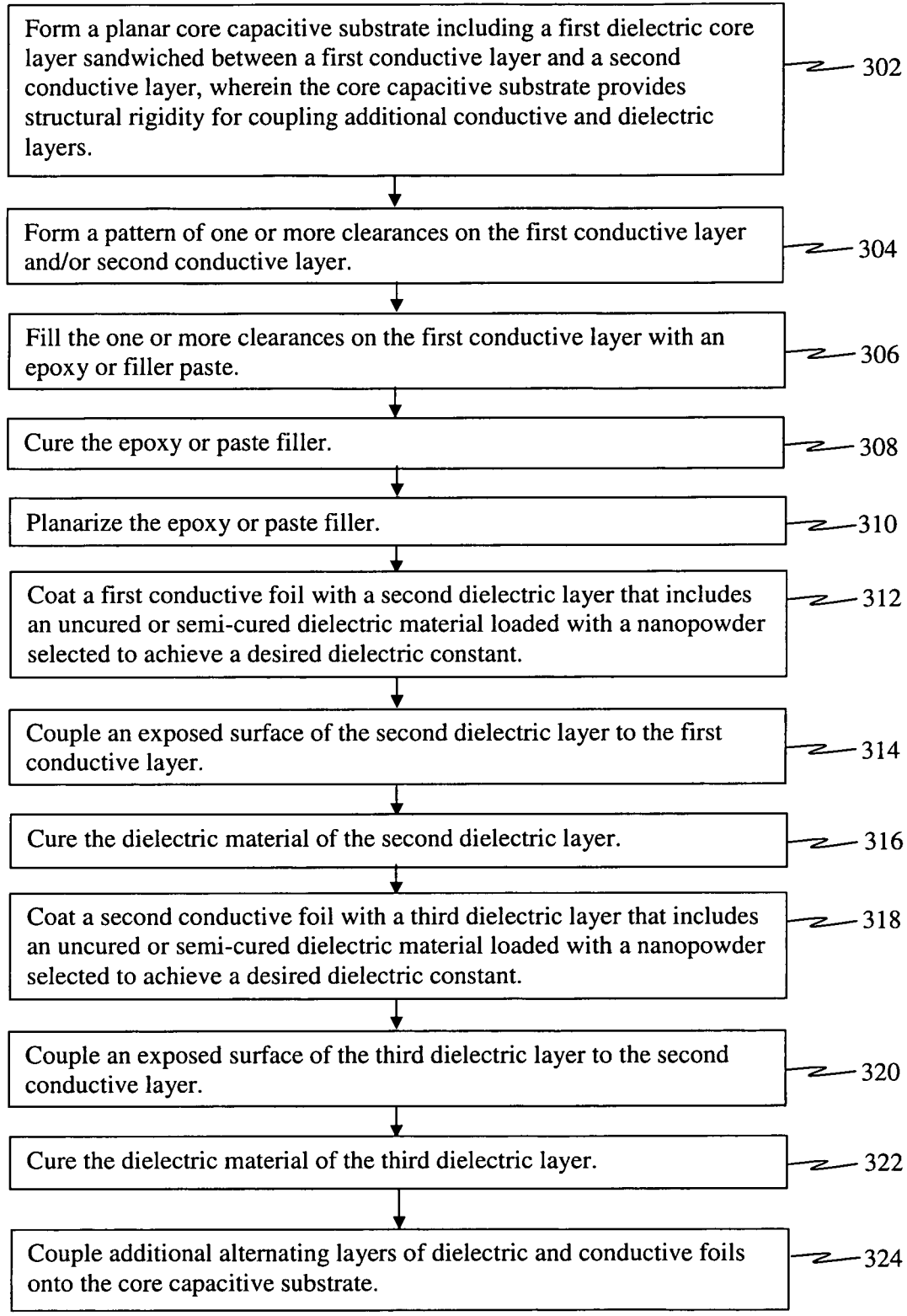
FIG. 3 illustrates a method for manufacturing an embedded core capacitive stack according to one example.

FIG. 3 illustrates a method for manufacturing a capacitive stack with high capacitive density. A planar core capacitive substrate is formed including a first dielectric core layer sandwiched between a first conductive layer and a second conductive layer, wherein the capacitive core substrate provides structural rigidity for coupling additional conductive and dielectric layers 302. A pattern of one or more clearances may be formed on the first conductive layer and/or second conductive layer 304. The one or more clearances on the first conductive layer may be filled with an epoxy or filler paste 306. The epoxy is then cured 308. The epoxy may then be planarized 310 to completely or substantially remove the excess epoxy or paste filler so that the surface(s) of the first conductive layer may be exposed.

A first conductive foil may be coated with a second dielectric layer that includes an uncured or semi-cured dielectric material loaded with a nanopowder selected to achieve a desired dielectric constant 312. An exposed surface of the second dielectric layer is then coupled to the first conductive layer 314 and the dielectric material of the second dielectric layer is cured 316. In some implementations, additional patterning (e.g., power/ground plane clearances, delineation of discrete capacitive regions, etc.) may be formed. This patterning may be filled with an epoxy and/or filler paste and excess epoxy or paste may be removed by planarization.

Similarly, a second conductive foil may be coated with a third dielectric layer that includes an uncured or semi-cured dielectric material loaded with a nanopowder selected to achieve a desired dielectric constant 318. An exposed surface of the third dielectric layer is coupled to the second conductive layer 320 and the dielectric material of the third dielectric layer is cured 322. Note that the second and third dielectric layers may be simultaneously coupled to the first and second conductive layers, respectively, and cured. Additional alternating layers of dielectric and conductive foils may be coupled onto the core capacitive substrate 324.

According to some examples, the core dielectric layer 104 may be between 0.5 and 4 mils thick (or preferably between 0.5 and 2.0 mils) while the first and/or second conductive layers 102 and 106 may each be between 0.5 and 6 mils thick. The combined thickness of the capacitive core (e.g., dielectric layer 102 and the first and second conductive layers 102 and 106) may be between approximately 1.5 and 16 mils. The second and/or third dielectric layers 204 and 206 may each be less than the thickness of first core dielectric layer 104. For instance, the second or third dielectric layers 204 and 206 may each be coated to a thickness of approximately between 0.08 and 1.5 mil. In some implementations, even thinner dielectric layers 204 and 206 of 0.004 mil (for example) may be formed by using thin film and/or vapor deposition processes. In one example, the second or third dielectric layers 204 and 206 may each have a thickness of approximately 1 mil or less. The conductive foils 202, 208, 220, and 222 may each have a thickness of between 0.12 and 6 mil. Note that additional conductive foils (e.g., between 0.12. and 6 mil thick) and additional dielectric layers (e.g., between 0.004 and 1.5 mil thick) may also be coupled to one or both sides of the capacitive stack.

In other examples, the core dielectric layer 104 may be approximately 0.75 mil thick or more while the first and/or second conductive layers 102 and 106 may each be between 1 and 4 mils thick. The second and/or third dielectric layers 204 and 206 may each be less than the thickness of first core dielectric layer 104. For instance, the second or third dielectric layers 204 and 206 may each be coated to a thickness of approximately between 0.3 mil or less. The conductive foils 202, 208, 220, and 222 may each have a thickness of between 0.12 and 1 mil thick.

Note that the present described methods may provide high-yield and/or high-volume manufacturing of capacitive stacks having ultra-thin capacitive layers stacked on a suitably rigid capacitive core. In prior art approaches, such thin capacitive layers have not been achieved as part of a capacitive stack. This is because the ultra-thin layers of dielectric 204 and 206 are quite brittle and difficult to handle on their own. Additionally, the technique described herein allows creating capacitive stacks having a greater capacitive constant per square inch than prior art capacitive stacks. For example, the use of ultra-thin capacitive layers may allow achieving capacitive densities of a few nano-Farads (e.g., 5 nano-Farads) to multiple micro-Farads per square inch.

Method of Manufacturing and Testing a Capacitive Stack

Referring again to FIG. 2, making the dielectric layers 204 and/or 206 thin or ultra-thin (e.g., 4 to 24 micron thick) increases the chance of inclusions and/or voids that can cause electrical arcing or a short between conductive layers/foils on opposite sides of a dielectric layer. In the prior art, a fault in an internal layer may not be identified until the circuit board is completed or, worse yet, when it is in operation. That is, conventional methods of manufacturing multilayer circuit boards typically couple all layers of the board in a single step. However, a fault in any one of the layers may cause the whole circuit board to be discarded, thereby wasting materials.

To address this problem, one feature provides for sequentially adding layers to the core capacitive substrate 100 and testing the integrity of each dielectric layer as it is added. The present approach forms the capacitive stack 200 by adding one or more capacitive layers (i.e., dielectric layers and conductive foils) either to one or both sides of the core capacitive substrate 100 and testing the integrity and/or electrical characteristics of each capacitive layer as it is added, thereby detecting faults early. To facilitate testing of each capacitive layer as it is added, test holes or clearances may be formed in the added conductive and dielectric layers that allow probing or accessing a covered/concealed conductive layer. Note that a dielectric layer and conductive foil may be added simultaneously on both sides of a core capacitive substrate and their integrity can be tested at the same time.

For instance, a first test hole 226 may be formed through the third conductive foil 202 and the first dielectric layer 204 to access the first conductive foil 102. The first test hole 226 may allow testing for faults (e.g., inclusions or voids) in the first dielectric layer 204 that may compromise the integrity of the stack 200. A resistance test or high-potential (hipot) test may be performed between conductive foils 102 and 202. A relatively high voltage may be applied to one of the conductive layers 202, and a corresponding voltage is measured at the other conductive layer 102. The first test hole 226 may serve to couple a probe to the first conductive layer 102 to apply and/or measure a voltage thereon during the hipot test. If the dielectric layer 204 is defective (i.e., if an electrical short exists between the two conductive layers 102 and 202), electric current flows or arcs between the conductive layers 102 and 202, and a corresponding voltage is detected at the other conductive layer 102. If such fault is detected, the capacitive stack 200 may be discarded without wasting additional materials and/or manufacturing resources.

Similarly, a second test hole 228 may be formed through the fourth conductive foil 208 and second dielectric layer 206, which can be used for testing for faults (e.g., inclusions or voids) in the second dielectric layer 206.

In one implementation, the test holes 226 and/or 228 may be formed after coupling the dielectric layers 204 and/or 206 and conductive foils 202 and/or 208 to the core capacitive substrate 100. Once coupled to the core capacitive substrate 100, test holes 226 and/or 228 may be formed by using, for example, laser, drilling, and/or other means.

In yet other implementations, the test holes 226 and/or 228 may be formed before the dielectric layers 204 and/or 206 and conductive foils 202 and/or 208 are coupled to the core capacitive substrate 100.

In other implementations, instead of using test holes to access or probe a covered conductive foil or layer, the edges of the conductive layers may be offset or staggered 230 to have access to the different layers. Alternatively, the conductive layers may have tabs (not shown) that protrude through the side of the capacitive stack to allow probing the individual conductive layers.

Figure 4:
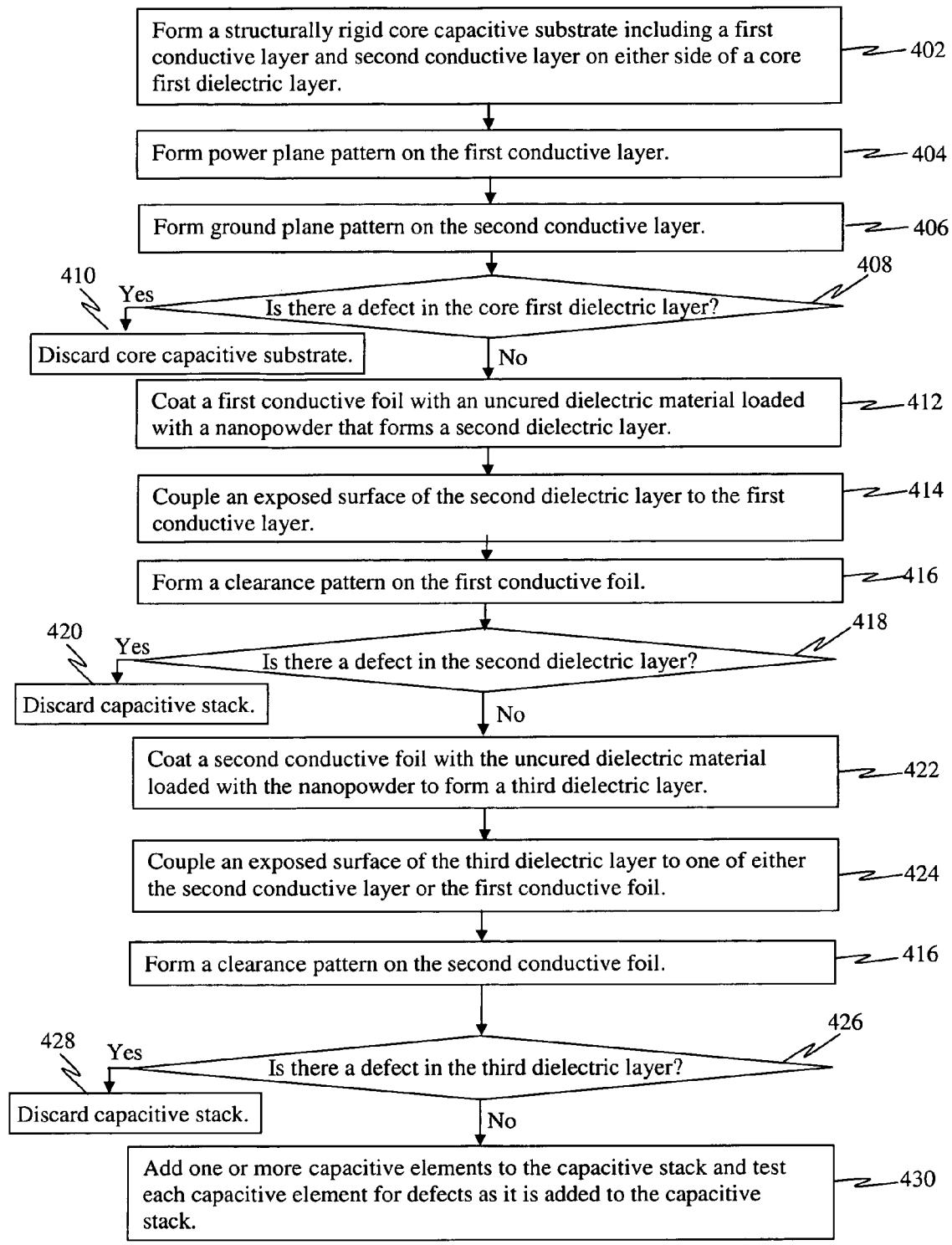
FIG. 4 illustrates a method for manufacturing an embedded core capacitive stack according to one example.

FIG. 4 illustrates a method for manufacturing an embedded core capacitive stack according to one example. A structurally rigid core capacitive substrate (e.g., core capacitive substrate 100 in FIG. 1) is formed including a first conductive layer and second conductive layer coupled on either side of a core first dielectric layer 402. The core capacitive substrate (e.g., Faradflex BC24) may be rigid or substantially rigid by including a cured dielectric material in the first dielectric layer. The first dielectric layer may be cured either before or after coupling of the first and second conductive foils. A power plane pattern (e.g., clearances) may be formed on the first conductive layer 404. Similarly, a ground plane pattern may be formed on the second conductive layer 406. The ground and/or power plane patterns may be formed by known methods (e.g., etching, etc.) before or after the first and second conductive foils are coupled to the core first dielectric layer. The ground and/or power plane patterns may form clearances for subsequent electrical paths and/or vias.

The core first dielectric layer may be tested to determine whether it is defective 408. For instance, a hipot test may be performed between the first and/or second conductive layers to determine whether there any faults (e.g., inclusions and/or voids) in the core first dielectric layer. If any faults are found, e.g., the first and second conductive layers are shorted, the core capacitive substrate may be reworked or discarded 410 before additional materials, time, and/or labor are wasted.

The power and/or ground plane patterns (e.g., clearance) may then be filled with an epoxy and/or filler paste. In some implementations, the excess epoxy and/or filler paste may be planarized or removed.

Thin conductive foils (e.g., ⅛ oz to 4 oz), each coated with an uncured or partially cured dielectric layer (e.g., 4 to 24 micron thick) may be stacked or coupled on either side of the patterned core capacitive substrate to form a capacitive stack. The dielectric layer for each conductive foil may be loaded with a nanopowder to increase the dielectric constant. As they are added to the core capacitive substrate (either on one side or both sides of the core capacitive substrate at once), the dielectric layers may be tested for faults (e.g., inclusions or voids) that compromise the electrical integrity of the overall capacitive stack (e.g., by causing shorts or arcing between conductive layers on either side of a dielectric layer).

For example, a first conductive foil is then coated with an uncured or semi-cured dielectric material loaded with a nanopowder that forms a second dielectric layer 412. The first conductive foil and the second dielectric layer are stacked onto the first conductive layer 414. For example, the first conductive foil and second dielectric layer may be laminated under temperature and/or pressure to the core capacitive substrate. In coupling the first conductive foil and second dielectric layer to the core capacitive substrate, heat and/or pressure may serve to cure the second dielectric layer. A ground/power pattern may also be formed on the first conductive foil 416 to achieve a desired power/ground configuration. Along with the electrical patterns, a blind test hole may be formed through the first conductive foil and second dielectric layer. This test hole may be located along a perimeter region (e.g., out of the circuit pattern area) and allow probing of the first conductive layer. In one example, the test hole(s) or clearances through a conductive foil and/or dielectric layer may be formed by a Ultra-Violet (UV) YAG or C02 laser.

In an alternative embodiment, the first conductive layer may be coated with the uncured or semi-cured dielectric material loaded with the nanopowder to form the second dielectric layer and the first conductive foil may then be coupled (e.g., laminated) to the second dielectric layer. In still another embodiment, the first conductive layer and the first conductive foil may both be coated with a dielectric material and the surfaces of the two dielectric coats may be coupled (e.g., laminated) together.

The second dielectric layer may then be tested or validated to ascertain its electrical integrity, e.g., whether there is a defect in the second dielectric layer 418. For example, a hipot test may be performed between the first conductive foil and the first conductive layer to determine whether they are electrically isolated from each other. For instance, a probe may electrically contact the first conductive layer (through a test hole in the first conductive foil) to determine whether a voltage applied to one conductive foil/layer is measured in the other conductive foil/layer. If the test indicates a defect in the second dielectric layer, the capacitive stack may be discarded 420. This pre-testing may be performed as layers are added to the capacitive stack, thereby identifying faulty or unreliable capacitive stacks early in their manufacturing process.

Similarly, a second conductive foil may also be coated with the uncured or semi-cured dielectric material loaded with the nanopowder to form a third dielectric layer 422. An exposed surface of the third dielectric layer is then coupled (e.g., laminated) to the second conductive layer to form a third capacitive element 424. In an alternative embodiment, the second conductive layer may be coated with the uncured or semi-cured dielectric material loaded with the nanopowder to form the third dielectric layer and the second conductive foil may then be coupled (e.g., laminated) to the exposed surface of the third dielectric layer. In still another embodiment, the second conductive foil and the second conductive layer may both be coated with the uncured or semi-cured dielectric material and the exposed surfaces of the two dielectric coats may be coupled together.

The third dielectric layer may then be similarly tested for defects 426. For example, a hipot test may be performed between the second conductive foil and the second conductive layer to ascertain whether they are electrically isolated from each other. If the test indicates a defect in the third dielectric element, the capacitive stack may be discarded 428.

The first and second conductive foils and second and third dielectric layers may be added to the capacitive stack at the same time. The second and third dielectric layers may also be tested at the same time.

One or more capacitive elements (e.g., conductive foils and dielectric layers) may be added to the capacitive stack and each capacitive element may be tested for defects as it is added to the capacitive stack 430.

Additionally, a conductive foil may be patterned to define one or more separate regions that may be utilized as distinct capacitive elements. Each of these separate regions may be tested to ascertain whether their corresponding dielectric layer is not defective (as discussed above).

Figure 5:
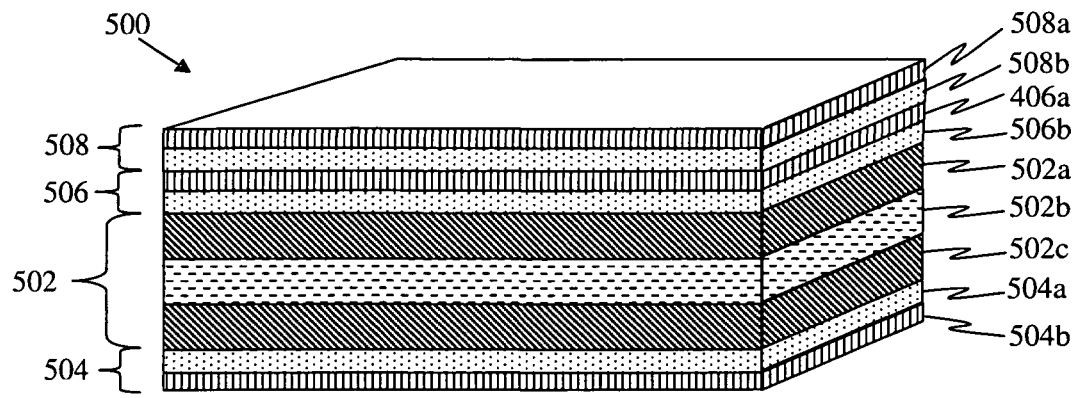
FIG. 5 illustrates a capacitive stack including a single capacitive element on the bottom of a core capacitive element and two capacitive elements on top of the core capacitive element.

Any number of capacitive layers may be added to the top and/or bottom of the first core capacitive substrate 502 and tested as they are added. For example, FIG. 5 illustrates a capacitive stack 500 including a core capacitive element 502 (conductive layers/foils 502a and 502c, and dielectric layer 502b) with a dielectric/conductive layer pair 504 (i.e., dielectric layer 504a and conductive foil 504b) on one side and two dielectric conductive layer pairs (i.e., dielectric layer 506b and conductive foil 506a and dielectric layer 508b and conductive foil 508a) on an opposite side.

Capacitive Stack With Isolated Planar Capacitive Elements

Another novel feature provides a printed circuit board including a core capacitive stack configurable to supply a parallel planar capacitive element having high capacitance density or a plurality of segregated, device-specific decoupling capacitive elements. Thus, the capacitive stack may be selectively configured to provide high capacitance or a plurality of segregated embedded planar capacitors or discrete value capacitors with specific value depending on an implementation.

Figure 6:
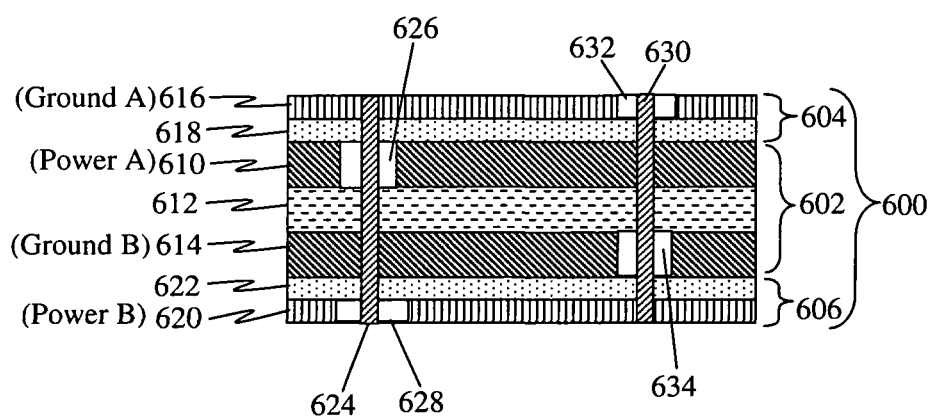
FIG. 6 illustrates how a core capacitive stack may be configured to provide a planar capacitive element having high capacitive density according to one example.

FIG. 6 illustrates how a core capacitive stack 600 may be configured to provide a planar capacitive element having high capacitive density according to one example. The capacitive stack 600 includes a core capacitive element 602, a first capacitive element 604, and a second capacitive element 606. The core capacitive element 602 may include a cured dielectric layer 612 sandwiched between a first and a second conductive layers (foils) 610 and 614. The first capacitive element 604 may be formed by a third conductive layer 616 coated with (or coupled to) a second dielectric layer 618. Similarly, the second capacitive element 606 may be formed by a fourth conductive layer 620 coated with a third dielectric layer 622.

A first electrically conductive via 624 is coupled to the third conductive layer 616 and second conductive layer 614, where both layers are parallel ground layers. A clearance 626 electrically isolates the via 624 from the first conductive layer 610. A second clearance 628 electrically isolates the via 624 from the fourth conductive layer 620.

A second electrically conductive via 630 is coupled to the first conductive layer 610 and fourth conductive layer 620, where both layers are parallel power layers. A third clearance 634 electrically isolates the via 630 from the second conductive layer 614. An fourth clearance 632 electrically isolates the via 630 from the third conductive layer 616.

In this example, an embedded planar capacitor having high capacitive density is formed by electrically connecting the second and third conductive layers 614 and 616 (coupled in parallel) and the first and fourth conductive layers 610 and 620 (also coupled in parallel). Thus, a device may be coupled to this multilayer embedded planar capacitor formed between the combination of the second and third conductive layers 614 and 616 and the first and fourth conductive layers 610 and 620.

Multiple levels of parallel layers may be added to the embedded capacitive stack 600 to build very high capacitive density, thereby achieving a potentially much higher capacitance per square inch than competing alternatives.

In one example, the dielectric layer 612 may be (or include) a dielectric material (e.g., Faradflex 24, Dupont Hk, etc.) approximately twenty-four (24) micrometers thick. The dielectric layers 618 and 622 may each be a nanopowder loaded dielectric material between two (2) and twenty-four (24) micrometers thick. The total thickness of the capacitive stack 600 may be between four (4) and eight (8) thousandths of an inch (mil). The nanopowder may be either a fired or prefired material, such as Barium Titanate for example. Note that the dielectric material and/or nanopowder material properties can be adjusted to achieve different levels of performance.

The same capacitive stack 600 may be configurable to provide a plurality of segregated, device-specific decoupling capacitive elements to one or more devices on the circuit board. Thus, instead decoupling of all electronic devices on a PCB with a shared embedded capacitance, this feature provides multiple isolated capacitive elements capable of being coupled to different electronic devices. Additionally, a single electronic device may have different leads coupled to different capacitive elements in the capacitive stack 600.

Figure 7:
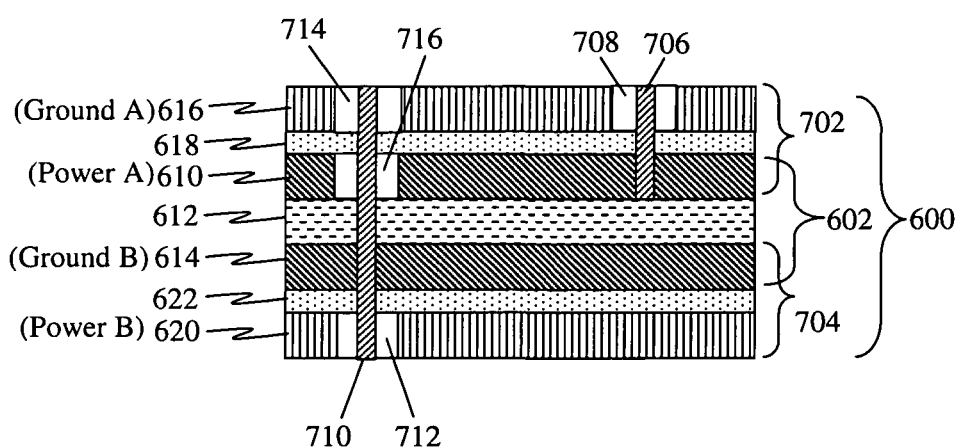
FIG. 7 illustrates how the capacitive stack may be configured to provide a plurality of segregated planar capacitive elements according to one example.

FIG. 7 illustrates how capacitive stack 500 may be configured to provide a plurality of segregated planar capacitive elements according to one example. In this example, a first capacitive element 702 may be formed between the first conductive layer 610 and the third conductive layer 616. A via 706 is coupled to the first conductive layer 610 and a first clearance 708 to allow an electronic device to be decoupled between the first conductive layer 610 and third conductive layer 616.

A second capacitive element 704 may be similarly formed between the second conductive layer 614 and the fourth conductive layer 620. A via 710 is coupled to the second conductive layer 614 and a passes through clearance 712 to allow an electronic device to be decoupled between second conductive layer 614 and the fourth conductive layer 620.

A third capacitive element 602 may be similarly formed by the core capacitive substrate 602 (i.e., between the first conductive layer 610 and the second conductive layer 614). The via 710 is coupled to the second conductive layer 614 and passes through clearances 714 and 716 to allow an electronic device to be decoupled between the second conductive layer 614 (through via 710) and the first conductive layer 610 (through via 706).

In this manner, the four-conductive layer capacitive stack 600 may be configured to provide three (3) separate planar capacitors 702, 704, and 602. This allows for the segregation of noisier components (devices) from other components (devices) requiring quieter power distribution.

This concept of configuring a capacitive stack to provide one or more desired capacitive elements may be expanded depending on the number of available conductive layers in a stack and the decoupling requirements of circuit components.

Figure 8:
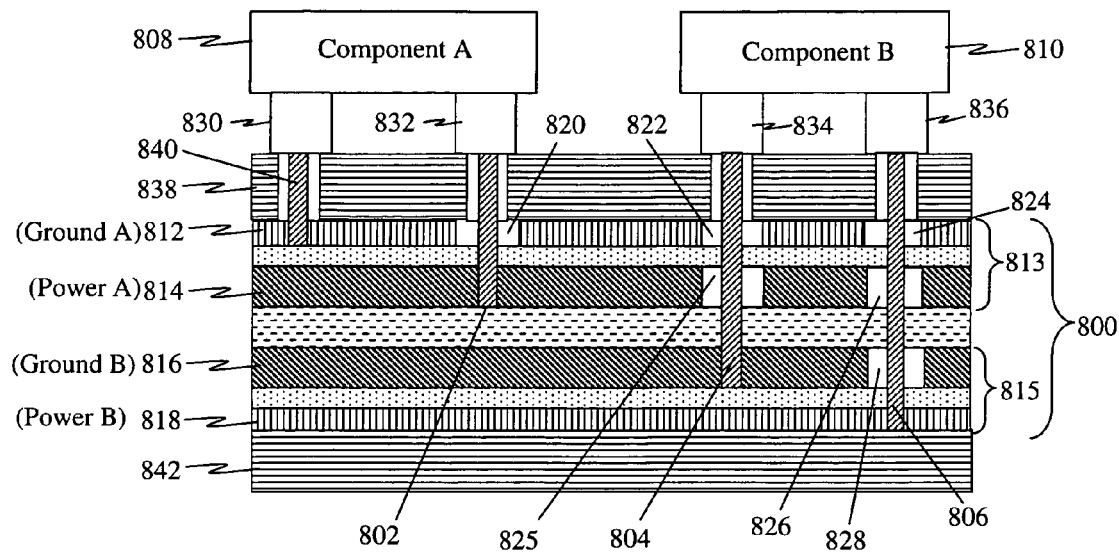
FIG. 8 illustrates another example of how a capacitive stack may be configured to form a plurality of isolated bypass capacitors to decouple electronic components.

FIG. 8 illustrates an example of how a capacitive stack 800 may be configured to provide a plurality of isolated capacitive planes to decouple electronic components. The capacitive stack 800 may include a plurality of alternating ground and power layers formed by a plurality of conductive foils 812, 814, 816, and 818 with dielectric layers in between. The capacitive stack 800 may be embedded or serve as the core for additional circuit layers 838 and 842 of a multi-layer substrate. These additional circuit layers 838 may be coupled on one or both planar surfaces of the capacitive stack 800. Thus, the capacitive stack 800 may be sandwiched between additional circuit layers. The stack 800 may provide one or more power and/or ground planes of one or more voltages for the circuit layers 838 and 842 and/or circuit components 808 and 810. The stack 800 may also provide one or more decoupling capacitive elements to the circuit components 808 and 810

A first leg 830 of a first component A 808 (e.g., integrated circuit device, etc.) is electrically coupled to a first conductive foil 812 through a conductive via 840. A second leg 832 of the first component A 808 is electrically coupled to a second conductive foil 814 by a via 802. The via 802 may be electrically isolated from the first conductive foil 812 by a clearance 820. A first capacitive element 813 is formed between the first and second conductive foils 812 and 814 providing bypass filtering to the first component A 808.

A second component B 810 may have a first leg 834 electrically coupled to a third conductive foil 816 by a via 804. The via 804 may be electrically isolated from the first conductive foil 812 by a clearance 822 and isolated from the second conductive foil 814 by a gap and/or clearance 825. A second leg 836 of the second component B 810 is electrically coupled to a fourth conductive foil 818 by a via 806. The via 806 may be electrically isolated from the other conductive foils 812, 814, and 816 by clearances 824, 826 and 828. A second capacitive element 815 is formed between the third conductive foil 816 and the fourth conductive foil 818 providing bypass filtering to the second component B 810.

By coupling the first component A 808 and the second component B 810 to the capacitive stack 800 in the way shown and described, the first component A 808 is decoupled by the first capacitive element 813 that is separate from the second capacitive element 815 which is used to decouple the second component B 810. Therefore, if the first component A 808 is a high noise device, its decoupling capacitive element 813 can be isolated from other devices so that it does not interfere with their operation. In this manner, various electronic devices on a circuit board may be isolated from each other, by having different embedded decoupling capacitive elements. In fact, different legs for a single electronic component may be decoupled by different embedded capacitive elements. Additionally, in the example of FIG. 8, a third capacitive element may be formed between the second conductive foil 814 and the third conductive foil 816.

Note that the first capacitive element 813 may provide power at a first voltage level to the first component A 808 while the second capacitive element 815 may provide power at a second voltage level to the second component B 810. In various implementations, the first and second voltage levels may be the same or they may be different.

Figure 9:
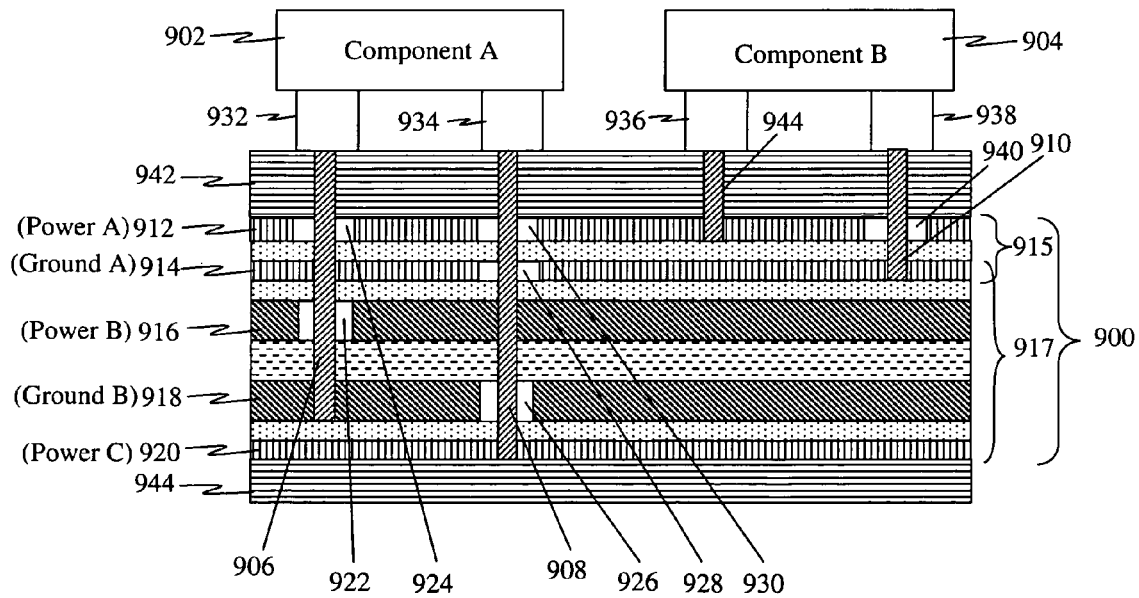
FIG. 9 illustrates another example of how a capacitive stack may be configured to form a plurality of distinct bypass capacitors to decouple electronic components.

FIG. 9 illustrates another example of how a capacitive stack 900 may be configured to form a plurality of distinct bypass capacitors to decouple electronic components. The capacitive stack 900 may include a plurality of alternating ground and power layers formed by conductive foils 912, 914, 916, 918, and 920 with dielectric layers in between them. The capacitive stack 900 may be constructed in a similar manner as the capacitive stacks illustrated in FIGS. 1, 2, 3 and/or 4. The capacitive stack 900 may be embedded or serve as the core for additional circuit layers 942 and/or 944 of a multi-layer substrate. These additional circuit layers 942 and/or 944 may be coupled on one or both planar surfaces of the capacitive stack 900. Thus, the capacitive stack 900 may be sandwiched between circuit layers 942 and 944 on either side of the capacitive stack 900.

A first leg 932 of a first component A 902 (e.g., integrated circuit device) is electrically coupled to second and fourth conductive foils 914 and 918 by a via 906. The via 906 may be electrically isolated from first and third conductive foils 912 and 916 by clearances 924 922. A second leg 934 of the first component A 902 is electrically coupled to third and fifth conductive foils 916 and 920 by a via 908. The via 908 may be electrically isolated from conductive foils 912, 914, and 918 by clearances 930, 926 and 928. The first component A 902 may thereby be electrically coupled to a first capacitive element 917 including a plurality of capacitive elements in parallel. By connecting the first component A 902 to a plurality of capacitive elements in parallel, the decoupling capacitance to the first component A 902 may be increased without the need for an additional surface-mounted discrete capacitor to the circuit board assembly.

A second component B 904 may have a first leg 936 electrically coupled to the first conductive foil 912 by a conductive via 944. A second leg 938 of the second component B 904 is electrically coupled to the second conductive foil 914 by a via 910. The via 910 may be electrically isolated from the conductive foil 912 by a clearance 940. The second component B 904 is thus coupled to a second capacitive element 915 that is separate from the first capacitive element 917 of the first component A 902. If the first component A 902 is a high noise device requiring greater capacitance, this configuration provides the increased capacitance and segregates the bypass first capacitive element 917 of the first component A 902 from the second capacitive element 915 of the second component B 904. Thus, the noise produced by first component A 902 does not interfere with second component B 904.

Although the embodiments discussed in FIGS. 8 and 9 illustrate the electronic component situated on one side of the capacitive stacks 800 and 900, components may be coupled on both sides of the capacitive stacks.

Figure 10:
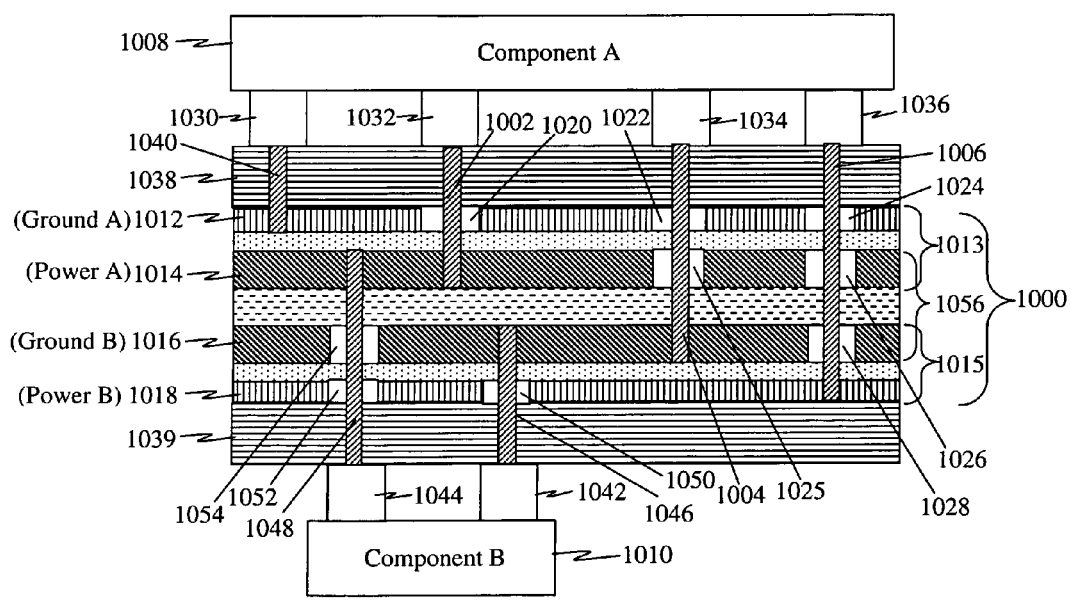
FIG. 10 illustrates yet another example of how a capacitive stack may be configured to form a plurality of distinct bypass capacitors to decouple electronic components on double-sided circuit board.

FIG. 10 illustrates yet another example of how a capacitive stack 1000 may be configured to form a plurality of distinct bypass capacitors to decouple electronic components on double-sided circuit board. The capacitive stack 1000 may include a plurality of alternating ground and power layers formed by a plurality of conductive foils 1012, 1014, 1016, and 1018 with dielectric layers in between. The capacitive stack 1000 may be embedded or serve as the core for additional circuit or signal layers 1038 and 1039 of a multi-layer substrate. Thus, the capacitive stack 1000 may be sandwiched or embedded between additional circuit or signal layers 1038 and 1039.

A first circuit component A 1008 may be mounted on first circuit layers 1038. A first leg 1030 of the first component A 91008 (e.g., integrated circuit device, etc.) is electrically coupled to a first conductive foil 1012 through a conductive via 1040. A second leg 1032 of the first component A 1008 is electrically coupled to a second conductive foil 1014 by a via 1002. The via 1002 may be electrically isolated from the first conductive foil 1012 by a clearance 1020. A first capacitive element 1013 is formed between the first and second conductive foils 1012 and 1014 providing bypass filtering to the first component A 1008. Similarly, a third leg 1034 of component A 1008 is electrically coupled to a third conductive foil 1016 by a via 1004. The via 1004 may be electrically isolated from the first conductive foil 1012 by a clearance 1022 and isolated from the second conductive foil 1014 by clearance 1025. A fourth leg 1036 of the first component A 1008 is electrically coupled to a fourth conductive foil 1018 by a via 1006. The via 1006 may be electrically isolated from the other conductive foils 1012, 1014, and 1016 by clearances 1024, 1026 and 1028. A second capacitive element 1015 is formed between the third conductive foil 1016 and the fourth conductive foil 1018 providing bypass filtering to the first component A 1010.

A second circuit component B 1010 may mounted on second circuit layers 939. A first leg 942 electrically coupled to a third conductive foil 1016 by a via 1046. The via 942 may be electrically isolated from the fourth conductive foil 918 by a clearance 1050. A second leg 1044 of the second component B 1010 is electrically coupled to a second conductive foil 1014 by a via 1048. The via 1048 may be electrically isolated from the other conductive foils 1016 and 1018 by clearances 1052 and 1054. A second capacitive element 1056 is formed between the second conductive foil 1014 and the third conductive foil 1016 providing bypass filtering to the second component B 1010.

The example illustrated in FIG. 10 allows coupling circuit component A 1008 to two segregated capacitive elements 1013 and 1015 while coupling circuit component B 1010 to another segregated capacitive element 1056.

Clearances isolation gaps may be formed in each conductive layer at any time during fabrication, such as prior to coupling the conductive foil to the capacitive stack, immediately after adding the conductive foil on the capacitive stack, and/or after all conductive foils are added to the capacitive stack. The clearances and/or isolation gaps may be formed using any method known in the industry such as drilling, punching, laser, and/or etching techniques.

Figure 11:
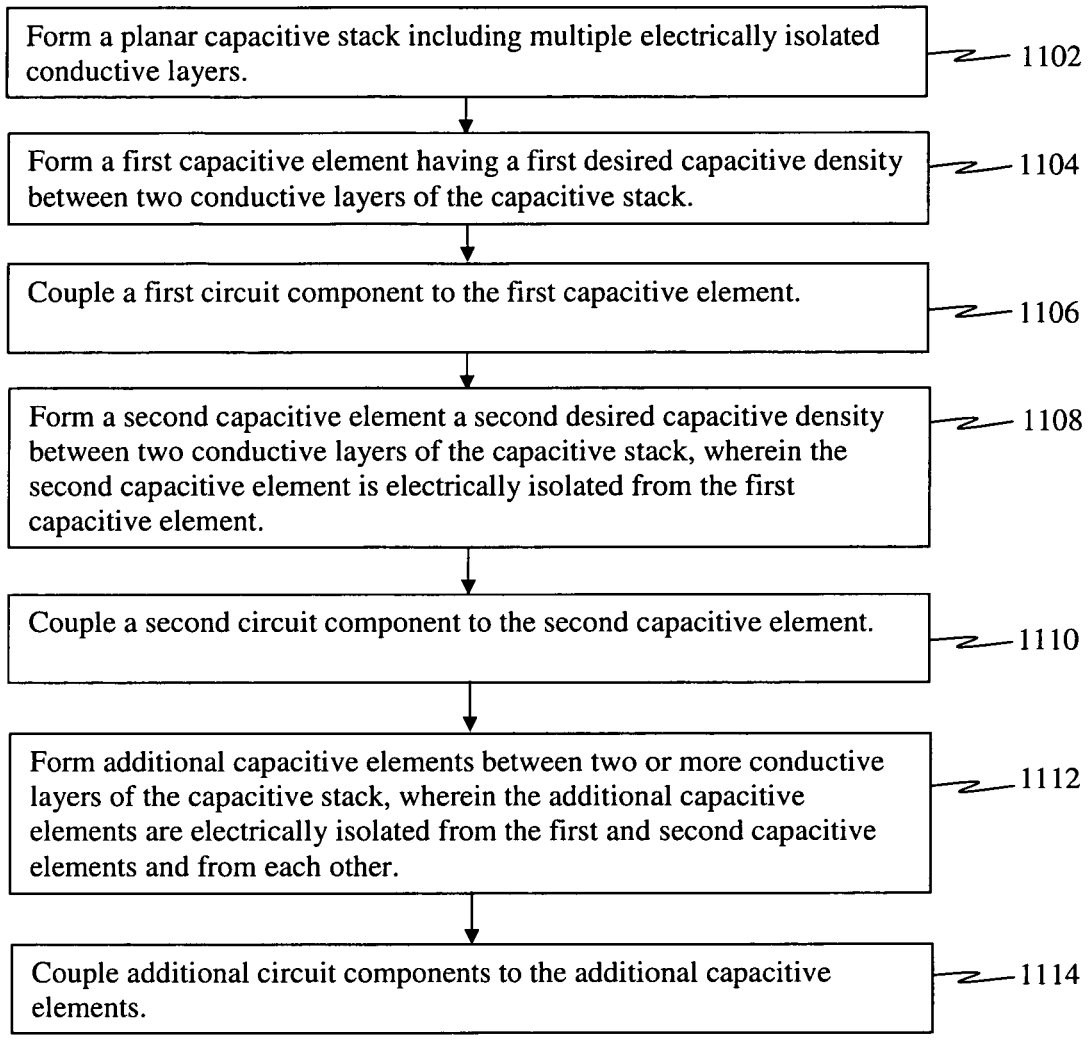
FIG. 11 illustrates a method for forming isolated decoupling capacitive elements in a capacitive stack according to one example.

FIG. 11 illustrates a method for forming isolated decoupling capacitive elements in a capacitive stack according to one example. A planar capacitive stack including multiple electrically isolated conductive layers is formed 1102. Such capacitive stack may be formed as described and illustrated in FIGS. 1, 2, and/or 3, for example. A first capacitive element having a first desired capacitive density is then formed between two conductive layers of the capacitive stack 1104. A first circuit component may be coupled to the first capacitive element 1106. In one example, the first capacitive density of the first capacitive element may be selected to provide bypass capacitance according to the electrical characteristics and/or needs of the first circuit component. A second capacitive element having a second desired capacitive density is formed between two conductive layers of the capacitive stack, wherein the second capacitive element is electrically isolated from the first capacitive element 1108. A second circuit component may be to the second capacitive element 1110. The second capacitive density may be selected to provide bypass capacitance according to the electrical characteristics and/or needs of the first circuit component. In some implementations, the first capacitive density and second capacitive density may be the same. In other implementations, the first and second capacitive densities may be different.

Additional capacitive elements may be similarly formed between two or more conductive layers of the capacitive stack, wherein the additional capacitive elements are electrically isolated from the first and second capacitive elements and from each other 1112. Additional circuit components may be coupled to the additional capacitive elements 1114.

In order to form each capacitive element, clearances may be formed in one or more layers of the capacitive stack either as each layer is added to the capacitive stack or after a plurality of layers have been added to the capacitive stack.

In some implementations, the planar capacitive stack described in FIG. 11 may be formed by the method(s) illustrated in FIGS. 1, 2, 3, and/or 4.

Embedded Discrete Capacitors

Yet another novel aspect provides for forming discrete capacitors within an embedded capacitive stack that may be used in a multilayered printed circuit board to provide localized decoupling capacitance to one or more devices. For example, a capacitive stack may be constructed as a subassembly and tested for defects prior to embedding into a circuit board. The discrete stacked capacitor may be formed by electrically isolating an area or region of a conductive layer of the capacitive stack. A desired capacitive value may be obtained by appropriately sizing the region or area for a given capacitive density of the dielectric layer(s).

Figure 12:
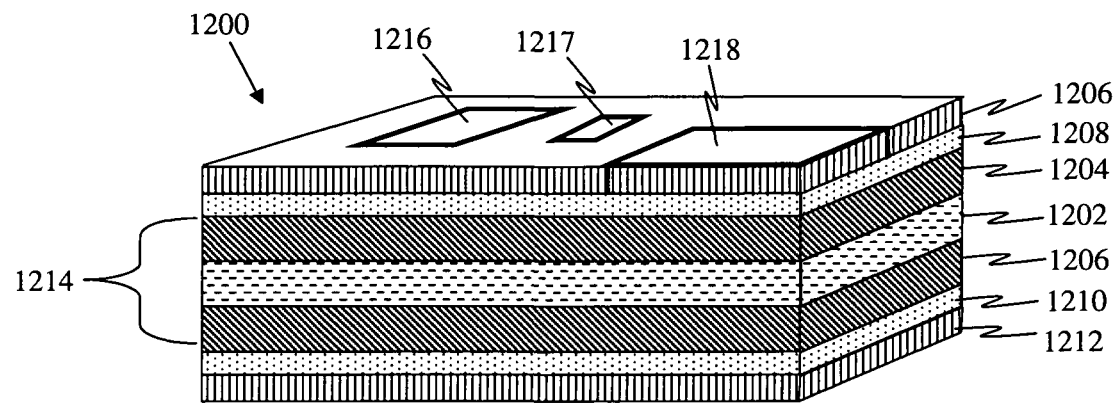
FIG. 12 illustrates an example of how one or more layers of a capacitive stack may be divided to provide additional decoupling capacitance to one or more circuit components.

FIG. 12 illustrates an example of how one or more layers of a capacitive stack 1200 may be divided to provide additional decoupling capacitance to one or more circuit components. The capacitive stack 1200 may be formed, for example, as described in FIGS. 1, 2, 3, 4, 5, 6, 7, 8, 9, 10 and/or 11. For instance, a core capacitive element 1214, including a dielectric layer 1202 sandwiched between conductive layers 1204 and 1206, may serve as a base on which to couple additional dielectric layers 1208 and 1210 and conductive layers 1206 and 1212. The capacitive stack 1200 may include a plurality of conductive and dielectric layers, power/ground patterns of clearances that define one or more capacitive elements that may be used without further fabrication or alteration.

One or more of the conductive layers may be patterned to define separate capacitive regions. For example, a first conductive layer 1206 may be patterned, etched, or otherwise processed to define regions 1216, 1217 and 1218 that are electrically isolated from the remaining portions of the first conductive layer 1206. Once the capacitive stack 1200 is formed and/or tested for defects, it may be embedded in a larger printed circuit board.

Independent of the capacitance provided by the first conductive layer 1206, the electrically isolated regions 1216, 1217 and/or 1218 may also serve to independently decouple one or more electronic devices. The discrete capacitors are formed between the isolated regions 1216, 1217, and 1218 and a corresponding opposite layer (e.g., conductive layer 1204). The amount of capacitance provided by the isolated regions 1216, 1217 and 1218 is defined by the area of each region (e.g., length×width) and the capacitive density of the dielectric layer (e.g., dielectric layer 1208). In this manner, electronic devices may be matched with a desired capacitive value defined by an isolated region.

The isolated regions 1216, 1217, and 1218 may also be tested for reliability after each layer is added to the capacitive stack by making a clearance (e.g., hole) to the next adjacent conductive layer and determining whether there is a short with the isolated regions 1216, 1217, and 1218.

Note that the isolated regions for the embedded discrete capacitors may be defined by etching or other mechanical or chemical processes as each conductive layer/foil is added to the capacitive stack. The methods described herein allow capacitors of any shape and/or size to be formed on the conductive layers/foils thereby reducing the need for surface mounted capacitors and, consequently, potentially allowing for circuit boards of small surface area.

Figure 13:
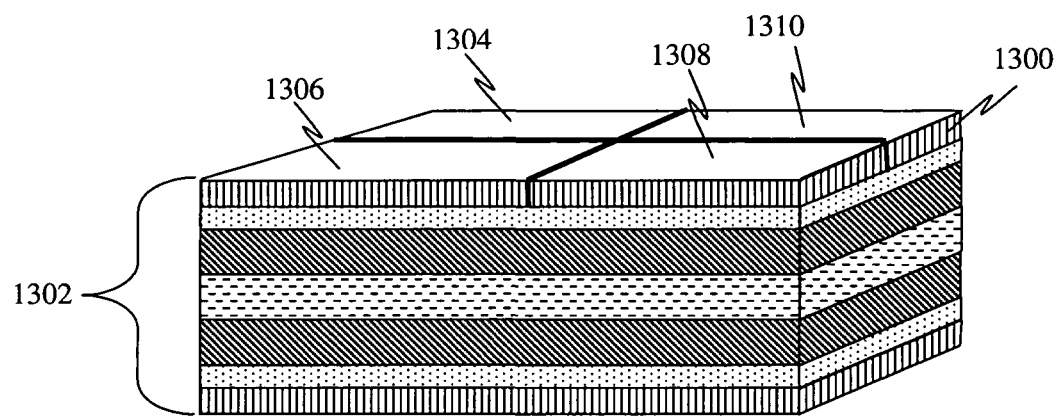
FIG. 13 illustrates yet another example of how one or more conductive layers of a capacitive stack may be divided into different areas or regions that are electrically isolated from other regions on the same conductive layer.

FIG. 13 illustrates yet another example of how one or more conductive layers of a capacitive stack 1302 may be divided into different areas or regions that are electrically isolated from other regions on the same conductive layer. In this example, the conductive layer 1300 in the capacitive stack 1302 may be divided into a plurality of regions 1304, 1306, 1308, and 1310. When embedded into a multi-layer circuit board or semi-conductor packaging, these separate regions 1304, 1306, 1308, and 1310 may operate at different voltages.

Figure 14:
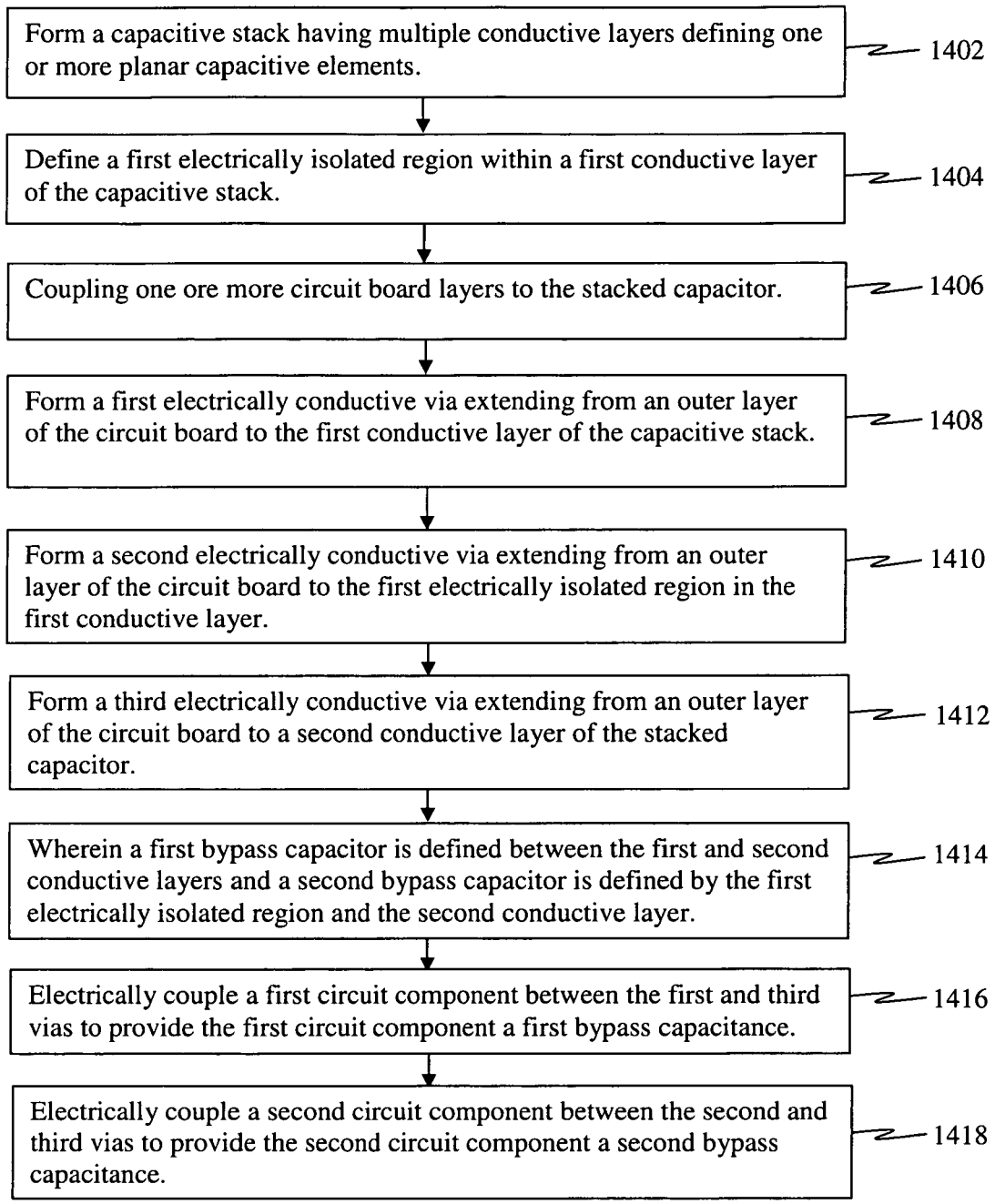
FIG. 14 illustrates a method for manufacturing a circuit board having an embedded stacked capacitor according to one example.

FIG. 14 illustrates a method for manufacturing a circuit board having an embedded capacitive stack according to one example. A capacitive stack is formed having multiple conductive layers defining one or more planar capacitive elements 1402. In one example, the capacitive stack is formed (e.g., as illustrated in FIGS. 1, 2, 3, 4, 5, 6, 7, 8, 9, 10, 11, 12, and/or 13). Such capacitive stack may serve as the core onto which circuit layers may be coupled on either side of the capacitive stack. A first electrically isolated region is defined within a first conductive layer of the capacitive stack 1404. This electrically isolated region may be formed or defined during the process of stacking the first conductive layer onto the capacitive stack. One or more circuit board layers may be coupled to the capacitive stack 1406. A first electrically conductive via is formed extending from an outer layer of the circuit board to the first conductive layer of the capacitive stack 1408. A second electrically conductive via is formed extending from the outer layer of the circuit board to the first electrically isolated region in the first conductive layer 1410. A third electrically conductive via is formed extending from the outer layer of the circuit board to a second conductive layer of the capacitive stack 1412. A first bypass capacitor may be defined between the first and second conductive layers and a second bypass capacitor may be defined by the first electrically isolated region and the second conductive layer 1414. A first circuit component may be coupled between the first and third vias to provide the first circuit component a first bypass capacitance 1416. Similarly, a second circuit component may be coupled between the second and third vias to provide the second circuit component a second bypass capacitance 1418. In some implementations, different electrical legs of a single circuit component may be decoupled by the first and second bypass capacitances. The area of the first electrically isolated region may be selected to obtain a desired capacitance.

Embedded Capacitive Stack for Chip-Scale Packaging

As noted in FIGS. 6, 7, 8, 9 and/or 10, the presently disclosed capacitive stack embeds multiple bypass capacitive layers within a core substrate for a circuit board or electronic platform, thereby reducing the parasitic inductance. That is, using embedded capacitors instead of surface mounted discrete capacitors reduces the path length signals travel which, in turn, reduces parasitic inductance. Consequently, various implementations of the capacitive stack disclosed reduce the length of the signal path by moving the capacitive elements closer to circuit components.

In the prior art, semiconductor devices are typically decoupled by separate discrete capacitors located on a circuit board on which the semiconductor packages are coupled.

In one example of the present claimed capacitive stack, the capacitive stack is embedded within the semiconductor packaging. Because the method described above allows making a very thin capacitive stack, it permits embedding the capacitive elements inside the semiconductor packaging rather than on a circuit board.

Figure 15:
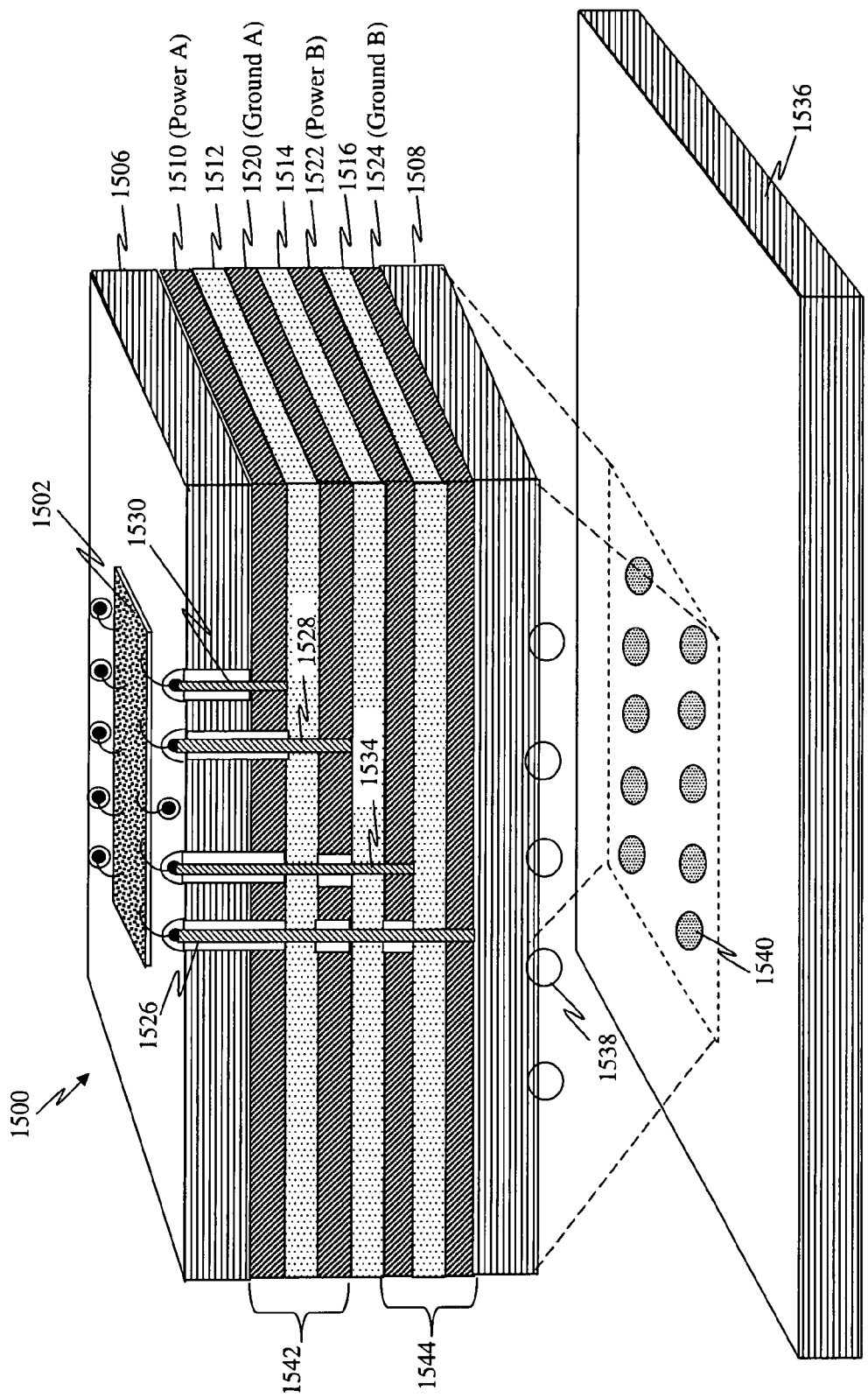
FIG. 15 illustrates one example of how a capacitive stack may be used within a chip-scale package to provide localized capacitance to a semiconductor device.

FIG. 15 illustrates one example of how a capacitive stack may be used within a chip-scale package 1500 to provide localized capacitance to a semiconductor device 1502. The chip-scale package 1500 may include a capacitive stack comprising a core capacitive element 1504 (i.e., dielectric layer 1514 sandwiched between conductive layers 1520 and 1522 and a plurality of dielectric layers 1512 and 1516 and conductive foils 1510 and 1524. In this example, the capacitive stack is sandwiched between one or more circuit layers 1506 and 1508. A semiconductor circuit 1502 may be coupled on a first circuit layer 1506. The first circuit layer 1506 may be patterned to allow electrically conductive vias 1526, 1528, 1530, and 1534 to couple to different legs of the semiconductor circuit 1502.

In this example, the semiconductor circuit 1502 is coupled to two distinct capacitive elements in the capacitive stack. A first capacitive element 1542 is formed by a first dielectric layer 1512 sandwiched between a second conductive layer 1510 and a first conductive foil 1520. A second capacitive element 1544 is formed by a second dielectric layer 1516 sandwiched between a second conductive foil 1522 and a third conductive foil 1524. A first via 1528 and a second via 1530 couple two different legs of the semiconductor circuit 1502 to the first capacitive element 1542. A third and fourth vias 1526 and 1534 couple two different legs of the semiconductor circuit 1502 to the second capacitive element 1544. In this manner, the bypass capacitance for the semiconductor circuit 1502 may be housed within the chip-scale package 1500.

The chip-scale package 1500 may then be coupled on a circuit board 1536. For example, a ball grid array may be used to couple a plurality of bumps 1538 on the chip-scale package 1500 to corresponding pads 1540 on the circuit board 1536.

It should be clearly understood that the features described herein may be implemented on circuit layers of different dimensions and/or materials. For instance, the (a) method of manufacturing and testing a capacitive stack, (b) method of providing a plurality of isolated planar capacitive elements, and/or (c) embedded stacked capacitor (or capacitive stack) may each be implemented in a multilayer board, silicon substrate, semiconductor device, chip-scale package, etc. In some implementations, the capacitive stack may be implemented as part of a multilayer circuit board on which electronic devices may be coupled. In other implementations, the capacitive stack may be implemented as part of silicon substrate (e.g., wafer) for semiconductors on which integrated circuits and/or microelectronic devices may be coupled or formed.

One or more of the components, steps, and/or functions illustrated in FIGS. 1-15 may be rearranged and/or combined into a single component, step, and/or function or in separated into several components, steps, and/or functions without departing from the invention. Additional elements, components, steps, and/or functions may also be added without departing from the invention.

While certain exemplary embodiments have been described and shown in the accompanying drawings, it is to be understood that such embodiments are merely illustrative of and not restrictive of the scope of the invention, and that this invention not be limited to the specific constructions and arrangements shown and described, since various other modifications are possible. Those skilled, in the art will appreciate that various adaptations and modifications of the just described preferred embodiment can be configured without departing from the scope and spirit of the invention. Therefore, it is to be understood that, within the scope of the appended claims, the invention may be practiced other than as specifically described herein.

What is claimed is:

1. A capacitive stack with high capacitive density, comprising:
    a substantially rigid planar core capacitive substrate including a first core dielectric layer sandwiched between a first conductive layer and a second conductive layer,
    wherein the planar core capacitive substrate is more rigid than one or more additional conductive and cured dielectric layers stacked and formed onto the planar core capacitive substrate and provides structural rigidity to the additional conductive and dielectric layers,
    wherein the first and second conductive layers are each approximately between 0.5-6 mils thick,
    wherein the one or more additional conductive and cured dielectric layers include:
        a plurality of conductive vias that are electrically coupled to one or more other conductive layers and/or pass through a clearance in the one or more other conductive and cured dielectric layers, and
        a plurality of test holes in the additional conductive and cured dielectric layers, wherein the test holes were used to access an exposed underlying conductive layer through an uppermost portion of the test hole, wherein the test holes are distinct from the plurality of conductive vias,
    wherein the one or more additional conductive and cured dielectric layers include a cured second dielectric layer coupled to the planar core capacitive substrate, the cured second dielectric layer having a first planar surface coupled to the first conductive layer of the substantially rigid planar core capacitive substrate and being thinner than the first core dielectric layer and including a dielectric material loaded with a nanopowder selected to achieve a desired dielectric constant; and
    a first conductive foil coupled to a second planar surface of the second dielectric layer, the first conductive foil is approximately between 0.25-1.5 mils thick.

2. The capacitive stack of claim 1, wherein the second dielectric layer is coated to a thickness of approximately between 0.004 and 1.25 mil.

3. The capacitive stack of claim 1, wherein the second dielectric layer is coated to a thickness of approximately 0.3 mil or less.

4. The capacitive stack of claim 1, wherein the first conductive foil is an ultra-thin foil having a thickness of between 0.12 and 1 mil.

5. The capacitive stack of claim 1, wherein the second dielectric layer provides a capacitive density of between five (5) and sixty (60) nano-Farads per square inch.

6. The capacitive stack of claim 1, wherein the first core dielectric layer is approximately between 0.5-4 mils thick and the second dielectric layer is approximately between 0.3 and 1 mil thick.

7. The capacitive stack of claim 1, further comprising a third dielectric layer having a third planar surface coupled to the second conductive layer, the third dielectric layer being thinner than the first core dielectric layer.

8. The capacitive stack of claim 7, wherein the first conductive layer and a second conductive foil, coupled to a fourth planar surface of the third dielectric layer, serve as power layers while the second conductive layer and first conductive foil serve as ground layers.

9. The capacitive stack of claim 1, wherein the thickness of the third dielectric layer is less than the thickness of the first core dielectric layer.

10. The capacitive stack of claim 1, wherein the second dielectric layer is between 0.004 mils and 0.05 mils.

11. The capacitive stack of claim 1, wherein the second dielectric layer is about 0.004 mils.

12. The capacitive stack of claim 1, further comprising an adhesive layer between the substantially rigid core capacitive substrate and the second dielectric layer.

13. The capacitive stack of claim 1, wherein the conductive layers are each between an eighth of an ounce per square foot foil and a six ounce per square foot foil.

14. The capacitive stack of claim 1, further comprising a third dielectric layer having a third planar surface coupled to the second conductive layer, the third dielectric layer being thinner than the first core dielectric layer, and wherein the first conductive layer and a second conductive foil, coupled to a fourth planar surface of the third dielectric layer, serve as power layers while the second conductive layer and first conductive foil serve as ground layers, and wherein the second dielectric layer is coated to a thickness of approximately between 0.004 and 1.25 mil, the first conductive foil is an ultra-thin foil having a thickness of between 0.12 and 1 mil, the second dielectric layer provides a capacitive density of between five (5) and sixty (60) nano-Farads per square inch, and the first core dielectric layer is approximately between 0.5-4 mils thick.

15. A capacitive stack with high capacitive density, comprising:
    a substantially rigid planar core capacitive substrate including a first core dielectric layer sandwiched between a first conductive layer and a second conductive layer,
    wherein the planar core capacitive substrate is more rigid than one or more additional conductive and cured dielectric layers stacked and formed onto the planar core capacitive substrate and provides structural rigidity to the additional conductive and dielectric layers,
    wherein the one or more additional conductive and cured dielectric layers include a cured second dielectric layer coupled to the planar core capacitive substrate, the cured second dielectric layer having a first planar surface coupled to the first conductive layer of the substantially rigid planar core capacitive substrate, the cured second dielectric layer being thinner than the first core dielectric layer and including a dielectric material loaded with a nanopowder selected to achieve a desired dielectric constant;

a first conductive foil coupled to a second planar surface of the second dielectric layer; and a pattern of one or more clearances extending from a top surface to a bottom surface of at least one of the first and second conductive layers;

wherein edges of the first and second conductive layers and edges of the one or more additional conductive layers including the first conductive foil are offset from or protrude through one or more edges of the capacitive stack to provide test probe access to the first and second conductive layers and the one or more additional conductive layers, wherein the first core dielectric layer is approximately between 0.5-4 mils thick, the first and second conductive layers are each approximately between 0.5-6 mils thick, one of the one or more additional cured dielectric layers is approximately between 0.3 and 1 mil thick, and one of the additional conductive layers is approximately between 0.25-1.5 mils thick.

16. The capacitive stack of claim 15, further comprising a third dielectric layer having a third planar surface coupled to the second conductive layer, the third dielectric layer being thinner than the first core dielectric layer.

* * * * *